(12) United States Patent
Soyano et al.

(10) Patent No.: US 9,179,578 B2
(45) Date of Patent: Nov. 3, 2015

(54) SEMICONDUCTOR MODULE AND HEAT RADIATION MEMBER

(75) Inventors: Shin Soyano, Shiojiri (JP); Masaki Ono, Nagano (JP); Kenji Suzuki, Azumino (JP); Akira Morozumi, Okaya (JP)

(73) Assignee: FUJI ELECTRIC CO., LTD. (JP)

( * ) Notice: Subject to any disclaimer, the term of this patent is extended or adjusted under 35 U.S.C. 154(b) by 103 days.

(21) Appl. No.: 13/389,878

(22) PCT Filed: Jul. 15, 2010

(86) PCT No.: PCT/JP2010/004610
§ 371 (c)(1),
(2), (4) Date: Feb. 10, 2012

(87) PCT Pub. No.: WO2011/024377
PCT Pub. Date: Mar. 3, 2011

(65) Prior Publication Data
US 2012/0140420 A1 Jun. 7, 2012

(30) Foreign Application Priority Data

Aug. 25, 2009 (JP) ................................ 2009-193944

(51) Int. Cl.
*G06F 1/20* (2006.01)
*H05K 7/20* (2006.01)
(Continued)

(52) U.S. Cl.
CPC .......... *H05K 7/2039* (2013.01); *H01L 23/3672* (2013.01); *H01L 23/3736* (2013.01);
(Continued)

(58) Field of Classification Search
CPC ........................ H05K 7/2039–7/20518; H05K 7/2089–7/20945; H01L 23/3672; H01L 23/3736; H01L 2924/1305; H01L 2924/13055

USPC ..................... 361/679.54, 704–723; 165/185; 257/720

See application file for complete search history.

(56) References Cited

U.S. PATENT DOCUMENTS 5,886,269 A 3/1999 Kai et al.
6,702,007 B1 * 3/2004 Pan et al. ...................... 165/185
(Continued)

FOREIGN PATENT DOCUMENTS

CN    1620592 A    5/2005
JP    4312105 Y    5/1968
(Continued)

OTHER PUBLICATIONS

International Search Report issued in PCT/JP2010/004610 dated Aug. 24, 2010.

(Continued)

*Primary Examiner* — Courtney Smith
*Assistant Examiner* — Zhengfu Feng
(74) *Attorney, Agent, or Firm* — Rossi, Kimms & McDowell LLP

(57) ABSTRACT

The characteristics of a heat radiation member used in a semiconductor module are improved.
A heat radiation member (10A) including an aluminum type member (20) which contains aluminum and a copper type member (30) which contains copper, which is embedded in the aluminum type member (20), and sides of which are enclosed by the aluminum type member (20) is formed. A semiconductor element is thermally bonded to the heat radiation member (10A) to fabricate a semiconductor module. The heat radiation member (10A) includes the aluminum type member (20) and the copper type member (30). As a result, it is possible to realize light weight while ensuring certain heat radiation. In addition, the copper type member (30) is enclosed by the aluminum type member (20). Accordingly, the strength of the heat radiation member (10A) can be increased.

8 Claims, 26 Drawing Sheets

(51) Int. Cl.
  *F28F 7/00* (2006.01)
  *H01L 23/34* (2006.01)
  *H01L 23/367* (2006.01)
  *H01L 23/373* (2006.01)
  *H01L 25/07* (2006.01)

(52) U.S. Cl.
  CPC ..... *H01L25/072* (2013.01); *H01L 2224/32225* (2013.01); *H01L 2924/1305* (2013.01); *H01L 2924/13055* (2013.01)

(56) References Cited

U.S. PATENT DOCUMENTS

| | | | |
|---|---|---|---|
| 7,219,721 B2* | 5/2007 | Miyazaki et al. | 165/185 |
| 2003/0116312 A1* | 6/2003 | Krassowski et al. | 165/185 |
| 2005/0006054 A1 | 1/2005 | Miyazaki et al. | |
| 2008/0058544 A1 | 3/2008 | Sasada et al. | |
| 2008/0156457 A1* | 7/2008 | Schaenzer et al. | 165/80.2 |

FOREIGN PATENT DOCUMENTS

| | | |
|---|---|---|
| JP | 08-186204 A | 7/1996 |
| JP | 09-298259 A | 11/1997 |
| JP | 3077765 U | 5/2001 |
| JP | 2002-184922 A | 6/2002 |
| JP | 2008-226916 A | 9/2008 |
| WO | 03061001 A1 | 7/2003 |

OTHER PUBLICATIONS

Chinese Office Action for corresponding CN 201080034710.6, dated Feb. 7, 2014. English translation provided.
Official Action issued in JP2012-501480 mailed Aug. 19, 2014. English translation provided.

* cited by examiner

SEMICONDUCTOR MODULE AND HEAT RADIATION MEMBER

TECHNICAL FIELD

This invention relates to a semiconductor module including a semiconductor element and a heat radiation member used for cooling the semiconductor element included in the semiconductor module.

BACKGROUND ART

A technique using a heat radiation member over which fins are arranged (heat sink) is known as one of techniques for cooling a semiconductor element which generates heat at the time of operation. The semiconductor element is thermally connected to such a heat radiation member to form a semiconductor module. Traditionally, a metal material, such as copper or aluminum, which has good thermal conductivity has widely been used for making a heat radiation member.

With a heat radiation member made mainly of copper, high heat radiation efficiency is obtained. However, the entire weight is heavy and the cost is high. Accordingly, a composite heat radiation member formed by integrating a member of copper with a member of aluminum which has the advantage in cost or fabrication is also proposed.

CITATION LIST

Patent Literature

PTL 1: Japanese Patent Publication 09-298259
PTL 2: Japanese Patent Publication 2002-184922

SUMMARY OF INVENTIONS

Technical Problem

With the composite heat radiation member, however, there are cases where the size of the heat radiation member, and therefore a semiconductor module using it, becomes large or where the strength of the connection of the members cannot be ensured, depending on a portion of the member of aluminum to which the member of copper is connected.

Solution to Problem

According to an aspect of the present invention, there is provided a semiconductor module including a heat radiation member having a first member which contains aluminum and a second member which contains copper, which is embedded in the first member, and sides of which are enclosed by the first member; and a semiconductor element which is thermally connected to the heat radiation member.

Advantageous Effects of Invention

By adopting the heat radiation member according to the present invention, it is possible to increase strength while ensuring light weight and heat radiation. By using this heat radiation member in a semiconductor module, a semiconductor element can be cooled stably.

The above and other objects, features and advantages of the present invention will become apparent from the following description when taken in conjunction with the accompanying drawings which illustrate preferred embodiments of the present invention by way of example.

DESCRIPTION OF EMBODIMENTS

Figure 1:
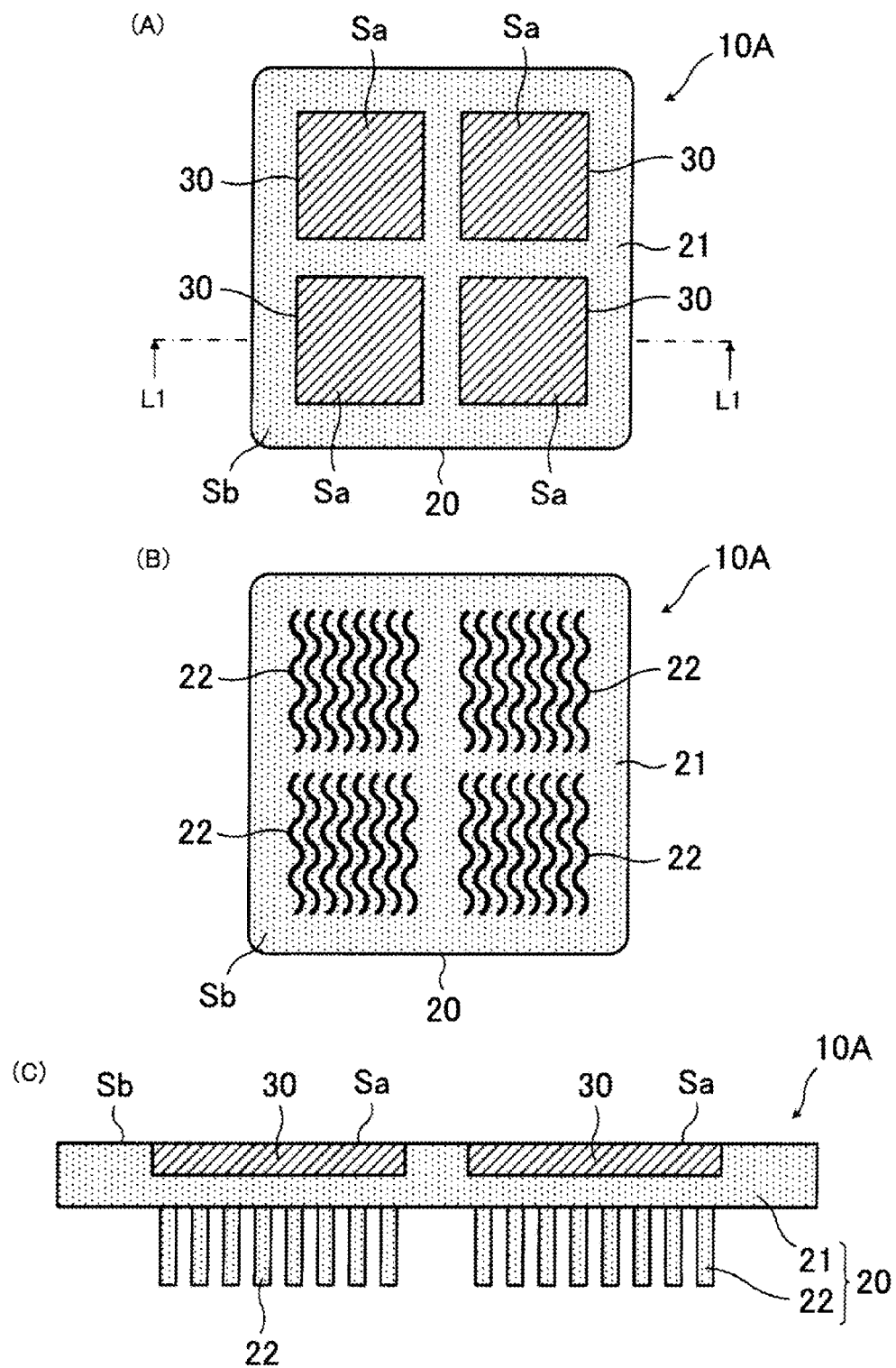
FIG. 1 illustrates an example of a heat radiation member according to a first embodiment.

A first embodiment will be described first.
FIG. 1 illustrates an example of a heat radiation member according to a first embodiment. FIG. 1(A) is a schematic plan view of an example of a heat radiation member according to a first embodiment from one surface, FIG. 1(B) is a schematic plan view of the example of the heat radiation member according to the first embodiment from the other surface, and FIG. 1(C) is a schematic sectional view taken along the dot-dash line of FIG. 1(A).

A heat radiation member 10A illustrated in FIG. 1 includes an aluminum type member 20 in which a plurality of fins 22 are arranged all over a plate-like base section 21 and copper type members 30 which are embedded in a surface of the base section 21 of the aluminum type member 20 opposite to the surface over which the plurality of fins 22 are arranged.

The base section 21 of the aluminum type member 20 and the plurality of fins 22 are formed by the use of aluminum or an alloy of aluminum. The copper type members 30 embedded in the aluminum type member 20 are formed by the use of copper or an alloy of copper. In this case, aluminum, an alloy of aluminum, copper, or an alloy of copper may contain a certain amount of impurity such as metal or nonmetal.

Figure 2:
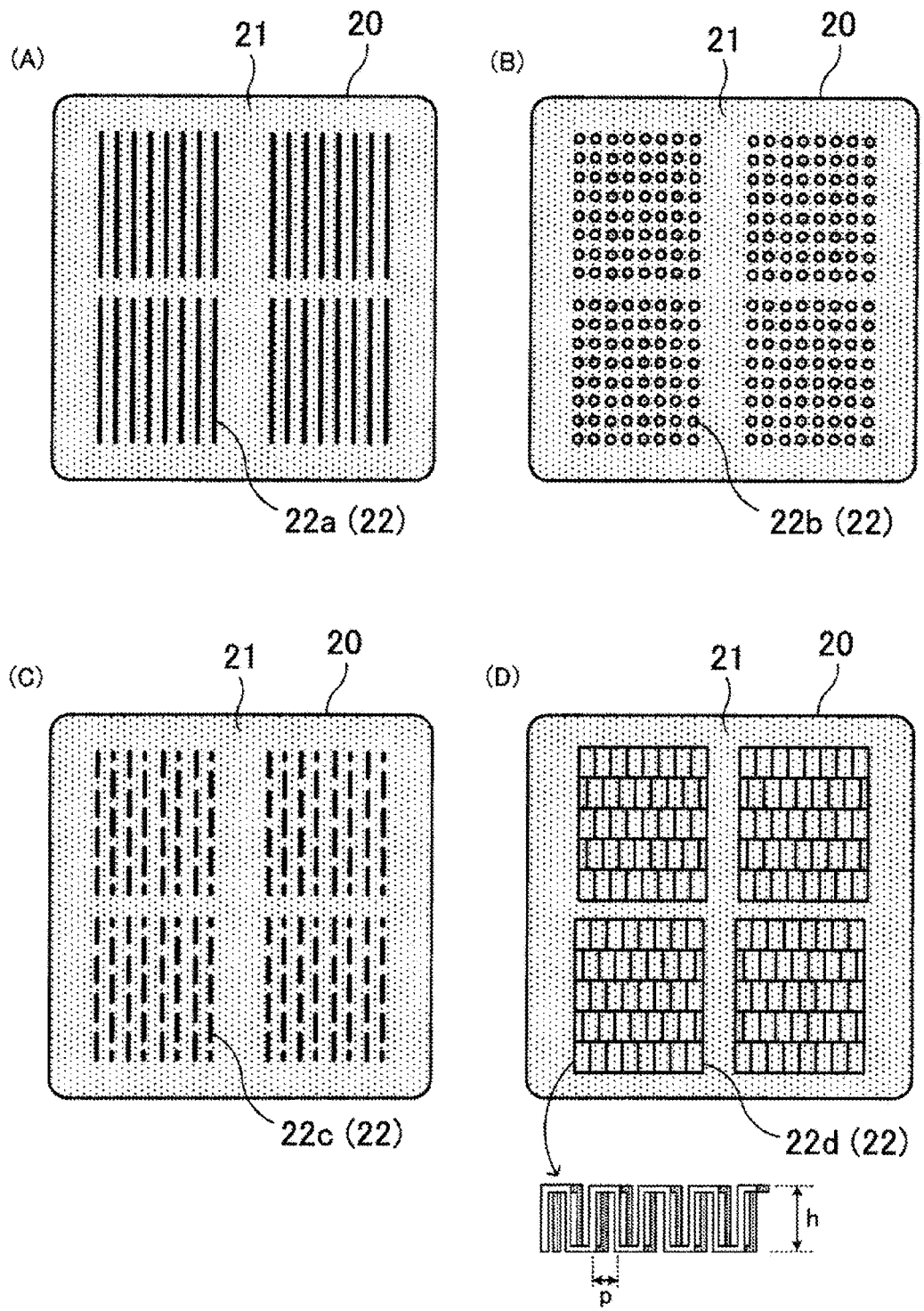
FIG. 2 illustrates an example of the shape of a fin.

The plurality of fins 22 arranged over the base section 21 of the aluminum type member 20 may be, for example, corrugated-plate-like fins illustrated in FIG. 1(B). These corrugated-plate-like fins 22 are arranged in each determined area over the surface of the base section 21 of the aluminum type member 20. In this example, the corrugated-plate-like fins 22 are used. However, plate-like fins 22a (FIG. 2(A)), pin-like fins 22b (FIG. 2(B)), staggered fins 22c (FIG. 2(C)), corrugated fins 22d (FIG. 2(D)) which are arranged at pitches of p and which are h in height, or the like may be used. Furthermore, in this example, the fins 22 are arranged in each area corresponding to an area in which the copper type member 30 is embedded. However, the fins 22 may be arranged in each area corresponding to adjacent areas in which the copper type members 30 are embedded. In addition, the fins 22 may be arranged over the surface of the base section 21 regardless of where the copper type members 30 are embedded.

As stated above, the heat radiation member 10A is what is called a composite heat radiation member formed by integrating the aluminum type member 20 which contains aluminum with the copper type members 30 each of which contains copper.

In this example, four flat-plate-like copper type members 30 are embedded in different portions of the aluminum type member 20. Viewed from above, the four flat-plate-like copper type members 30 are arranged in two rows and two columns. Each copper type member 30 is embedded in the aluminum type member 20 with one surface exposed. In this example, a surface Sa of each copper type member 30 exposed from the aluminum type member 20 and a surface (end) Sb of the aluminum type member 20 (base section 21) in which each copper type member 30 is embedded are equal in level, that is to say, there is no difference in level between them. Each copper type member 30 embedded in the aluminum type member 20 is in a state in which its surfaces except the exposed surface Sa (surface opposite to the surface Sa and sides) are touching the base section 21 of the aluminum type member 20.

As stated above, each copper type member 30 is in a state in which all the sides are enclosed by the aluminum type member 20. Accordingly, with the heat radiation member 10A each copper type member 30 is held firmly by the aluminum type member 20, compared with a composite heat radiation member formed by bonding a member of copper to a member of aluminum with all or part of the sides of the member of copper exposed.

In addition, with the heat radiation member 10A each copper type member 30 is embedded in the aluminum type member 20. Therefore, the heat radiation member 10A can be formed thin. As a result, the heat radiation member 10A itself and a semiconductor module in which the heat radiation member 10A is thermally connected to a semiconductor device can be miniaturized.

Moreover, the heat radiation member 10A is formed by the use of the aluminum type member 20 and the copper type members 30. Accordingly, compared with the case where the entire heat radiation member is formed by the use of aluminum or an alloy of aluminum, high thermal conductivity and heat radiation can be ensured. As a result, it is not necessary to increase the size of a heat radiation member for ensuring heat radiation or to increase the plane size of a semiconductor device thermally connected to a heat radiation member, that is to say, to increase heat transfer area for ensuring heat radiation. In addition, compared with the case where the entire heat radiation member is formed by the use of copper or an alloy of copper, the heat radiation member 10A is lightweight.

The heat radiation member 10A is formed in this way by the use of the aluminum type member 20 and the copper type members 30. By doing so, it is possible to realize light weight, miniaturization, and high strength while ensuring certain heat radiation.

The heat radiation member 10A having the above structure can be formed by, for example, die casting.

Figure 3:
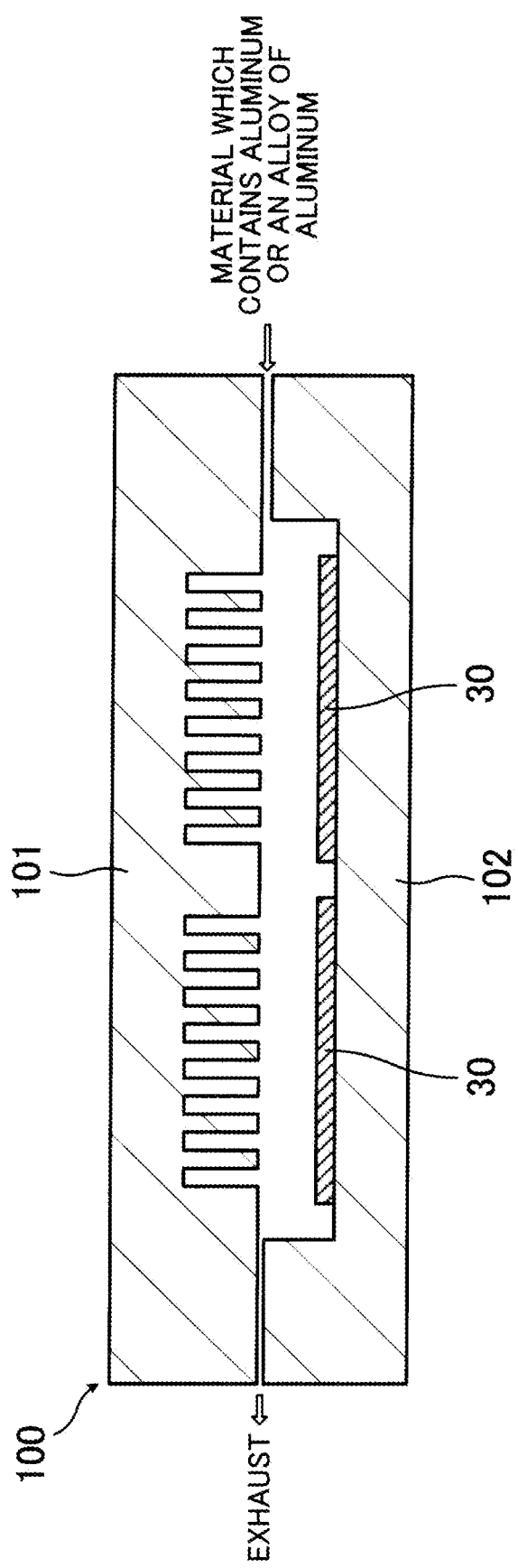
FIG. 3 illustrates an example of a method for forming a heat radiation member.

FIG. 3 illustrates an example of a method for forming a heat radiation member.

In order to form the heat radiation member 10A, the four flat-plate-like copper type members 30 of determined size (plane size and thickness) each of which contains copper or an alloy of copper are prepared first. The four flat-plate-like copper type members 30 are then arranged at determined positions in a metal mold 100 (including an upper metal mold 101 and a lower metal mold 102) for forming the aluminum type member 20.

As illustrated in FIG. 3, for example, the metal mold 100 to be used is formed in advance to the shape of the base section 21 of the aluminum type member 20 and the fins 22. The copper type members 30 are placed on the lower metal mold 102 of the metal mold 100 and are covered with the upper metal mold 101. The positions of the copper type members 30 arranged in the metal mold 100 are set on the basis of, for example, the arrangement of semiconductor devices thermally connected to the heat radiation member 10A to be formed.

After the copper type members 30 are arranged in the metal mold 100, a material in a molten state which contains aluminum or an alloy of aluminum is forced into the metal mold 100. By doing so, the basic structure of the heat radiation member 10A is formed. That is to say, as stated above, the plurality of protruding fins 22 are formed over one surface of the base section 21 and the four copper type members 30 are embedded in the other surface (end Sb). The four copper type members 30 are not protruding. After that, the heat radiation member 10A is taken out of the metal mold 100 and flash portions are removed by press work or the like.

If the heat radiation member 10A is formed by this method, it is possible to integrate the aluminum type member 20 with the copper type members 30 easily and firmly without using a bonding material such as solder or a compound.

A method for forming the heat radiation member 10A is not limited to the above method. For example, the following method may be used. The base section 21 of the aluminum type member 20 and the copper type members 30 are formed integrally by the above die casting. After that, the plurality of fins 22 are bonded to the surface of the base section 21 opposite to the surface (end Sb) in which the copper type members 30 are embedded by a technique such as welding or diffusion bonding.

An example of the structure of a semiconductor module in which the heat radiation member 10A having the above structure is used will now be described. For example, a semiconductor device which is illustrated in FIG. 4 and which includes at least one semiconductor element is thermally connected to the heat radiation member 10A.

Figure 4:
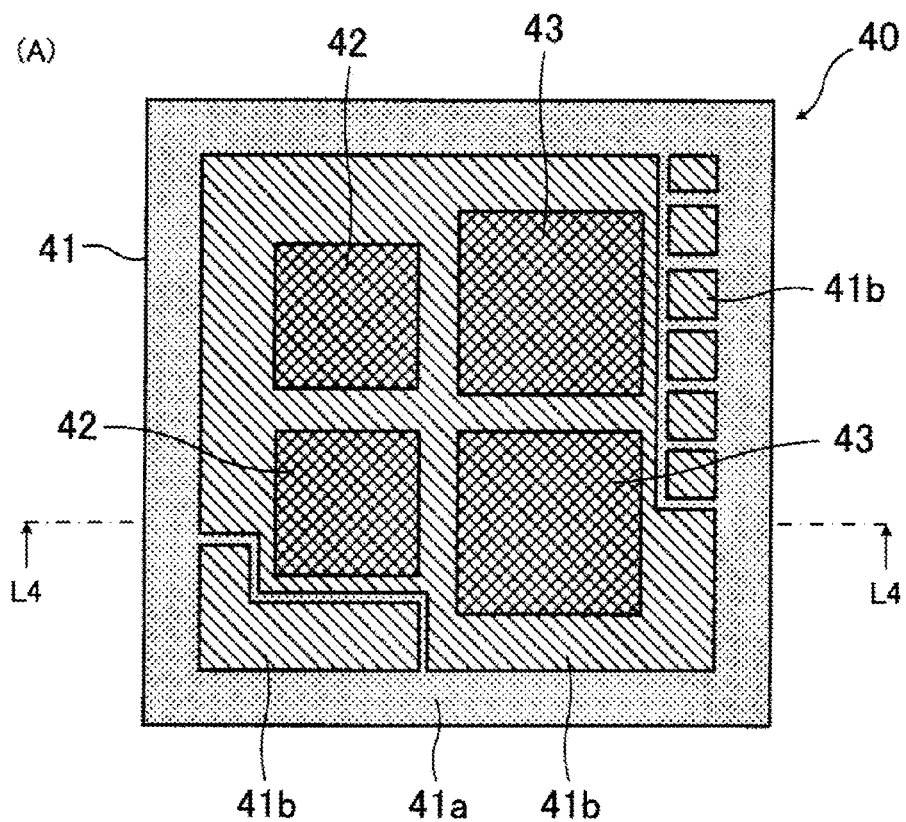
FIG. 4 illustrates an example of a semiconductor device.
Figure 4:
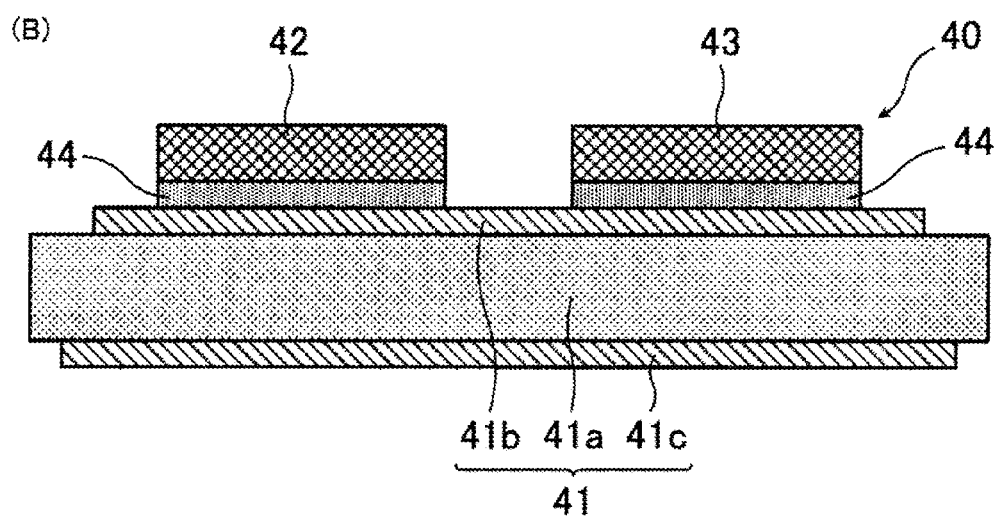

FIG. 4 illustrates an example of a semiconductor device. FIG. 4(A) is a schematic plan view of a semiconductor device and FIG. 4(B) is a schematic sectional view taken along the dot-dash line of FIG. 4(A).

With a semiconductor device 40 illustrated in FIG. 4, two kinds of semiconductor elements are mounted over a board 41. Two semiconductor elements 42 and two semiconductor elements 43, that is to say, a total of four semiconductor elements are mounted. The board 41 is obtained by forming conductor patterns 41b and 41c over both surfaces of an insulating board 41a.

A ceramic board of aluminum nitride, aluminum oxide, or the like can be used as the insulating board 41a of the board 41. The conductor patterns 41b and 41c over the insulating board 41a can be formed by the use of metal such as copper (copper foil).

In this example, power semiconductor elements are used as the semiconductor elements 42 and 43 mounted over the board 41 having the above structure. For example, the semiconductor elements 42 are FWDs (Free Wheeling Diodes) and the semiconductor elements 43 are IGBTs (Insulated Gate Bipolar Transistors).

The semiconductor elements 42 and 43 are bonded to the conductor pattern 41b side of the board 41 by the use of a bonding layer 44 of solder or the like and are electrically connected to the conductor pattern 41b directly or via wires (not illustrated).

A semiconductor module is fabricated by thermally bonding at least one semiconductor device 40 having the above structure to the above heat radiation member 10A.

Figure 5:
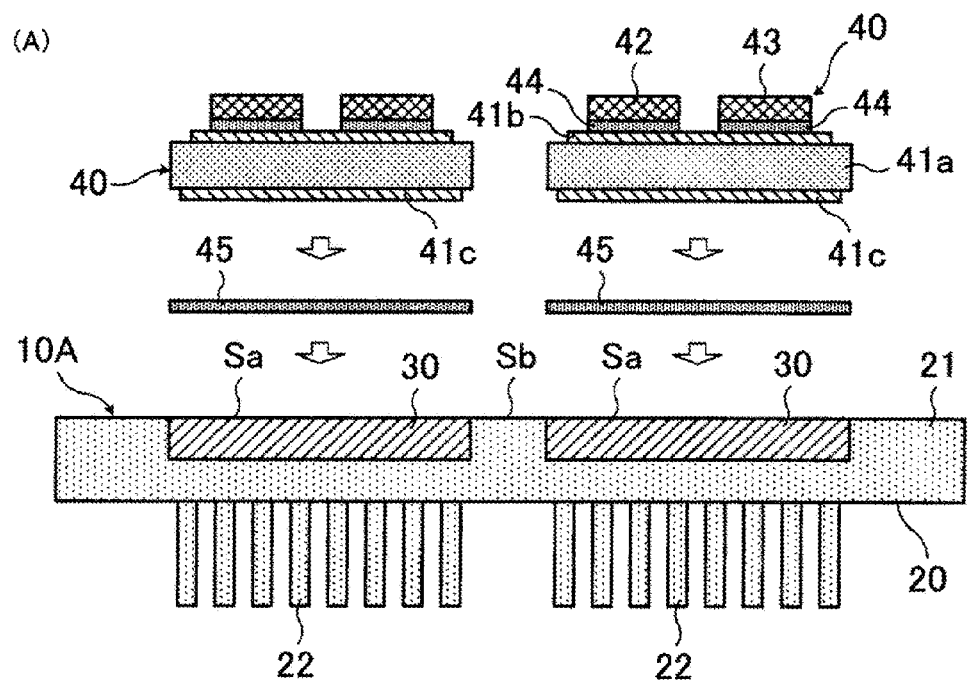
FIG. 5 illustrates an example of a method for fabricating a semiconductor module according to a first embodiment.
Figure 5:
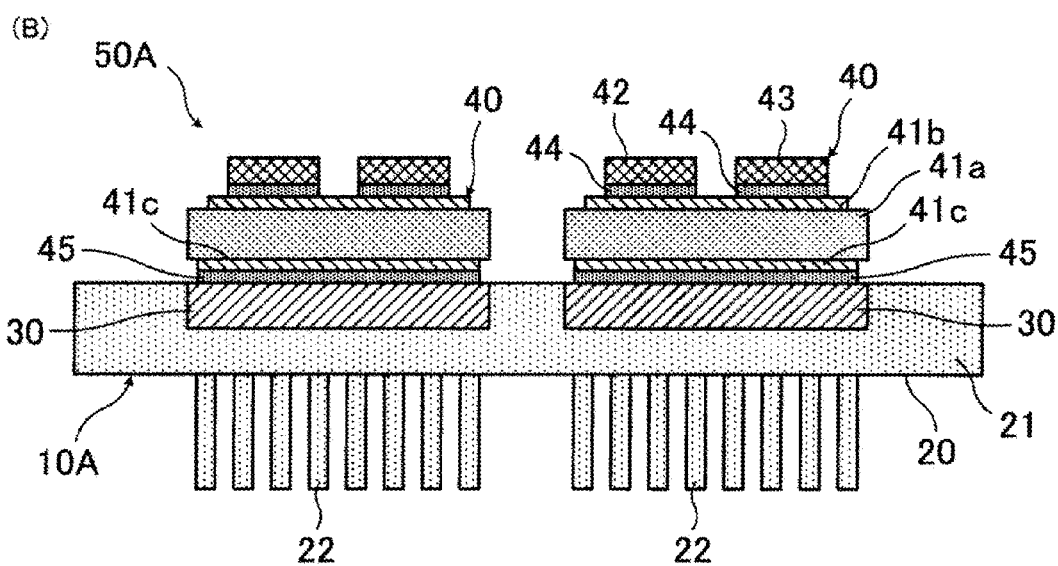

FIG. 5 illustrates an example of a method for fabricating a semiconductor module according to a first embodiment. FIG. 5(A) illustrates a state before bonding and FIG. 5(B) illustrates a state after bonding.

As illustrated in FIG. 5(A), the surface of the semiconductor device 40 opposite to the surface over which the semiconductor elements 42 and 43 are mounted, that is to say, the conductor pattern 41c of the semiconductor device 40 is bonded to the heat radiation member 10A via a bonding layer 45 of solder or the like.

At this time the semiconductor device 40 is bonded to the exposed surface Sa of the copper type member 30 embedded in the aluminum type member 20 of the heat radiation member 10A via the bonding layer 45. In this example, the semiconductor device 40 is bonded to the exposed surface Sa of each of the four copper type members 30 via the bonding layer 45. As a result, a semiconductor module 50A in which the semiconductor device 40 is bonded over each copper type member 30 of the heat radiation member 10A is fabricated. In the semiconductor module 50A each semiconductor device 40 and the heat radiation member 10A are in a state in which they are thermally connected.

Protection layers for protecting against contamination, corrosion, external force, or the like may be formed by, for example, nickel plating over the exposed surfaces of the conductor patterns 41b and 41c and the surfaces of the wires via which the semiconductor elements 42 and 43 and the conductor pattern 41b are electrically connected.

In the above semiconductor module 50A heat generated by the semiconductor elements 42 and 43 of the semiconductor device 40 is transferred, for example, to the heat radiation member 10A and is radiated from there to the outside. In this case, heat generated by the semiconductor elements 42 and 43 is transferred, for example, to the copper type member 30 under the semiconductor device 40, is then transferred to the aluminum type member 20 (base section 21 and fins 22) which encloses the copper type member 30, and is radiated to the outside. As a result, an excessive rise in the temperature of the semiconductor elements 42 and 43 can be controlled and destruction or runaway of the semiconductor elements 42 and 43 can be controlled. It is a matter of course that a path along which heat generated by the semiconductor elements 42 and 43 is radiated is not limited to this path.

With the above semiconductor module 50A the semiconductor device 40 is bonded over the exposed surface Sa of the copper type member 30 embedded in each of four portions of the aluminum type member 20. When the heat radiation member 10A is formed, the number and arrangement of the copper type members 30 are set on the basis of the number and arrangement of the semiconductor devices 40 used in the semiconductor module 50A. In addition, the size (plane size) of the copper type members 30 is set on the basis of the size (plane size) of the semiconductor devices 40 used in the semiconductor module 50A.

With the above semiconductor module 50A including the four semiconductor devices 40, for example, the heat radiation member 10A in which the four copper type members 30 are embedded in the four portions of the aluminum type member 20 corresponding to the positions of the four semiconductor devices 40 specified by arrangement, wiring layout, and the like is used. If the heat radiation member 10A is formed by the above die casting, then the copper type members 30 should be arranged in the metal mold 100 on the basis of the relative positions of the copper type members 30 and the semiconductor devices 40.

For example, the plane size of each copper type member 30 is larger than or equal to the plane size (plane size of the board 41, for example) of the semiconductor device 40 bonded thereover. It is not necessary that the four copper type members 30 should be equal in plane size. The upper limit of the plane size of each copper type member 30 is determined by the plane size of the aluminum type member 20, the plane size of the other copper type members 30 embedded in the aluminum type member 20, and the like.

The semiconductor module 50A using the heat radiation member 10A has been described. With the above semiconductor module 50A thermal expansion and thermal shrinking occur in the heat radiation member 10A and the semiconductor devices 40 due to heat generation by the semiconductor elements 42 and 43. At this time force which warps the heat radiation member 10A may be at work due to a difference in degree of thermal expansion and thermal shrinking caused by a difference in linear expansion coefficient of constituent material between the heat radiation member 10A which contains aluminum and copper and each semiconductor device 40 which includes the insulating board 41a of a ceramic or the like.

With the heat radiation member 10A, however, all the sides of each copper type member 30 are enclosed by the aluminum type member 20. Therefore, even if force which warps the heat radiation member 10A is at work, each copper type member 30 is held firmly by the aluminum type member 20 and a situation in which, for example, each copper type member 30 separates from the aluminum type member 20 can be averted.

For example, it is assumed that a heat radiation member is formed by simply bonding a flat-plate-like copper type member over an aluminum type member or that a heat radiation member is formed by embedding a flat-plate-like copper type member in an aluminum type member with a pair of opposite sides exposed. With these heat radiation members all or part of the sides of the copper type member are exposed and are not held by the aluminum type member. Therefore, if force which causes the above warp is at work, a warp occurs and the copper type member may separate from the aluminum type member.

With the above heat radiation member 10A the sides of each copper type member 30 are enclosed by the aluminum type member 20. Accordingly, the separation of each copper type member 30 from the aluminum type member 20 can be controlled effectively. As a result, it is possible to make the semiconductor module 50A using the heat radiation member 10A operate stably for a long period of time.

The above heat radiation member 10A may have a structure illustrated in FIG. 6, 7, 8, or 9.

Figure 6:
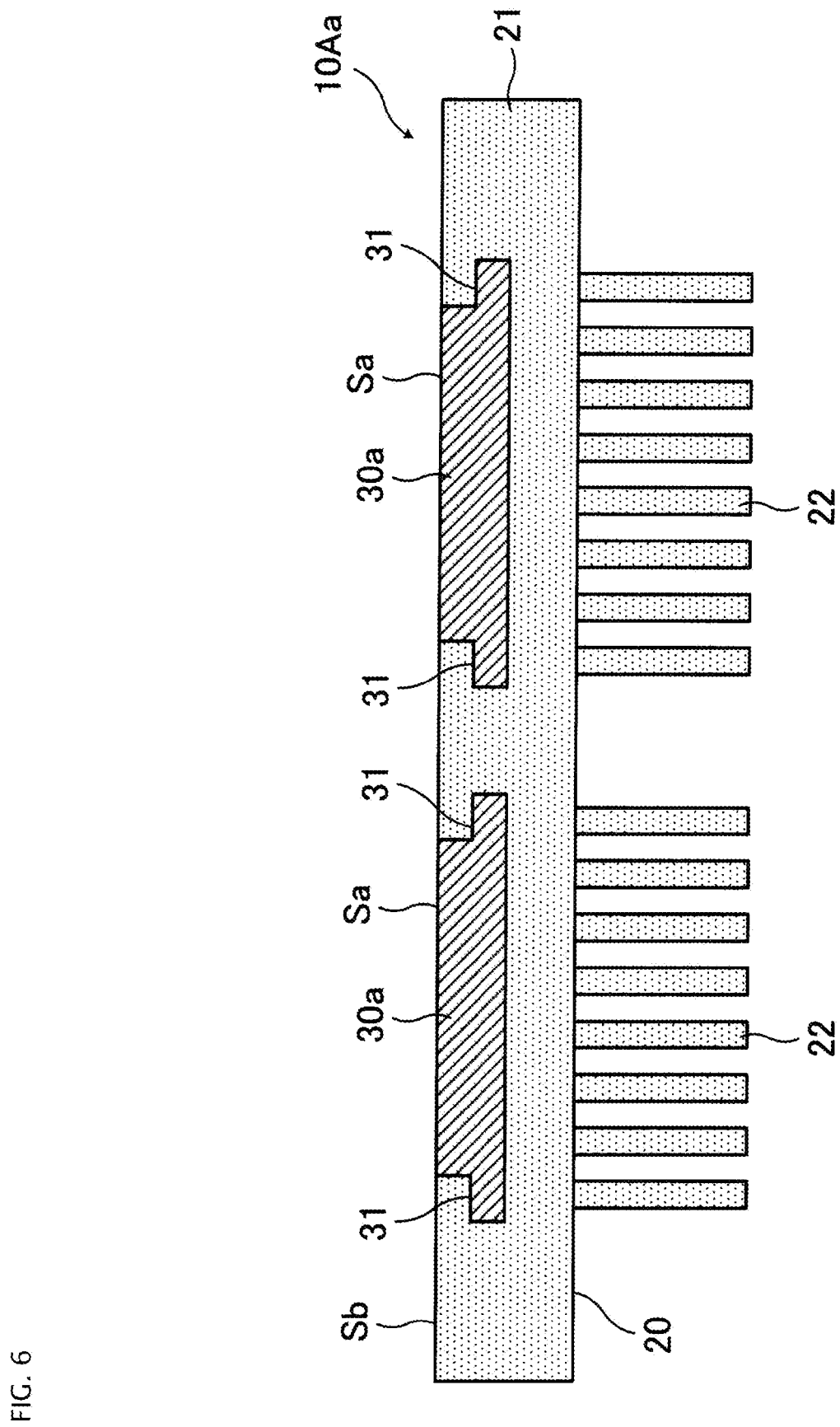
FIG. 6 illustrates a first modification of the heat radiation member according to the first embodiment.

FIG. 6 illustrates a first modification of the heat radiation member according to the first embodiment.

A step 31 is formed at each edge portion of a copper type member 30a used in a heat radiation member 10Aa illustrated in FIG. 6. The step 31 is covered with a base section 21 of an aluminum type member 20. That is to say, the sides of the copper type members 30a each including the step 31 are enclosed by the aluminum type member 20. An exposed surface Sa of the copper type member 30a and an end Sb of the aluminum type member 20 are equal in level. The heat radiation member 10Aa having the above structure can be formed by, for example, die casting, except for preparing the copper type member 30a with the step 31. This is the same with the above heat radiation member 10A.

By adopting this structure, the copper type member 30a is held more firmly by the aluminum type member 20. Accordingly, the separation of the copper type member 30a from the aluminum type member 20 can be controlled more effectively.

The step 31 can be formed throughout the edge portions of the copper type member 30a. Furthermore, the step 31 can be formed at part of the edge portions of the copper type member 30a. In this case, for example, the step 31 can be formed at constant intervals at all of the edge portions of the copper type member 30a or at the edge portions of the four corners of the copper type member 30a.

Figure 7:
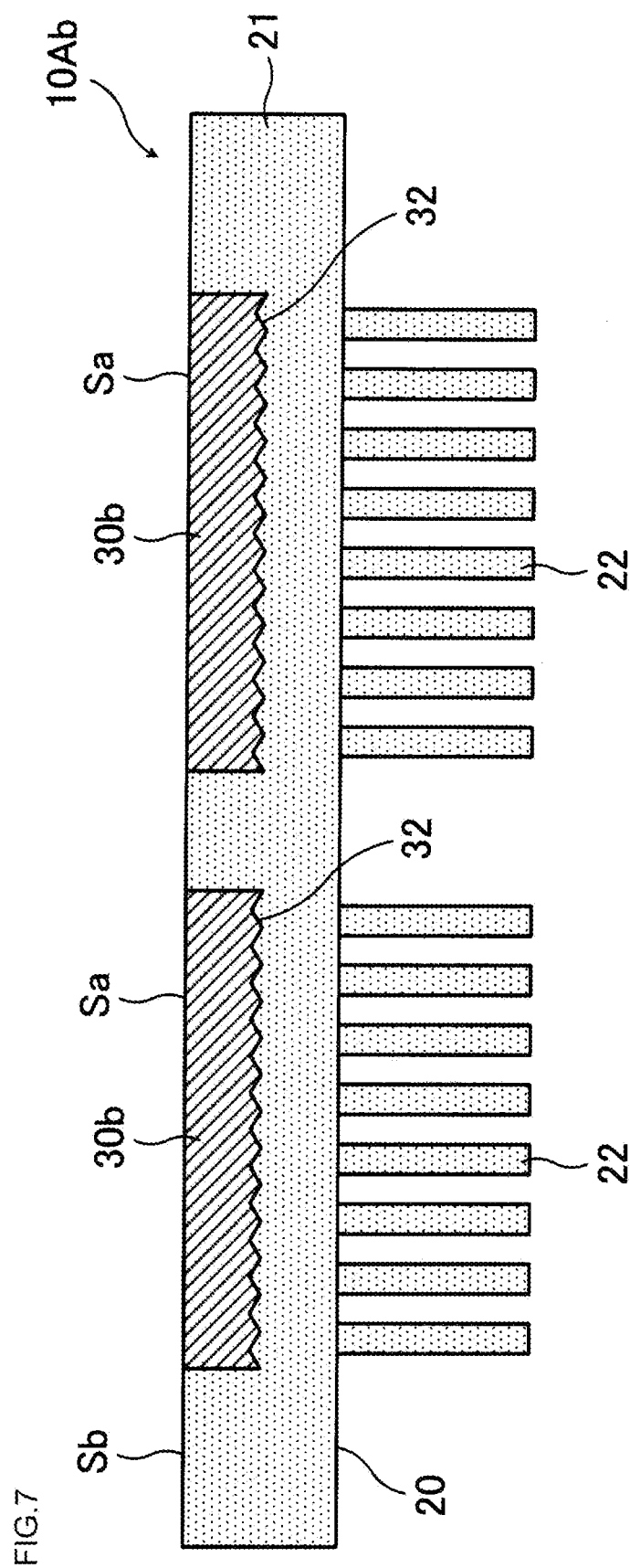
FIG. 7 illustrates a second modification of the heat radiation member according to the first embodiment.

FIG. 7 illustrates a second modification of the heat radiation member according to the first embodiment.

With a heat radiation member 10Ab illustrated in FIG. 7, irregularities 32 are formed on all or part (part, in this example) of the sides of a copper type member 30b which touch an aluminum type member 20. An exposed surface Sa of the copper type member 30b and an end Sb of the aluminum type member 20 are equal in level. The irregularities 32 can be formed by blasting, etching, or the like. The heat radiation member 10Ab including the above copper type member 30b can be formed by, for example, die casting, except for preparing the copper type member 30b with the irregularities 32. This is the same with the above heat radiation member 10A.

By adopting this structure, the surface area of the copper type member 30b increases and the area of contact between the copper type member 30b and the aluminum type member 20 increases. As a result, the copper type member 30b is held more firmly by the aluminum type member 20. Accordingly, the separation of the copper type member 30b from the aluminum type member 20 can be controlled more effectively.

A heat radiation member using a copper type member including both of the step 31 and the irregularities 32 illustrated in FIGS. 6 and 7, respectively, can be formed.

In the above description the case where the four discrete copper type members 30 are used is taken as an example. However, these copper type members 30 may be connected together.

Figure 8:
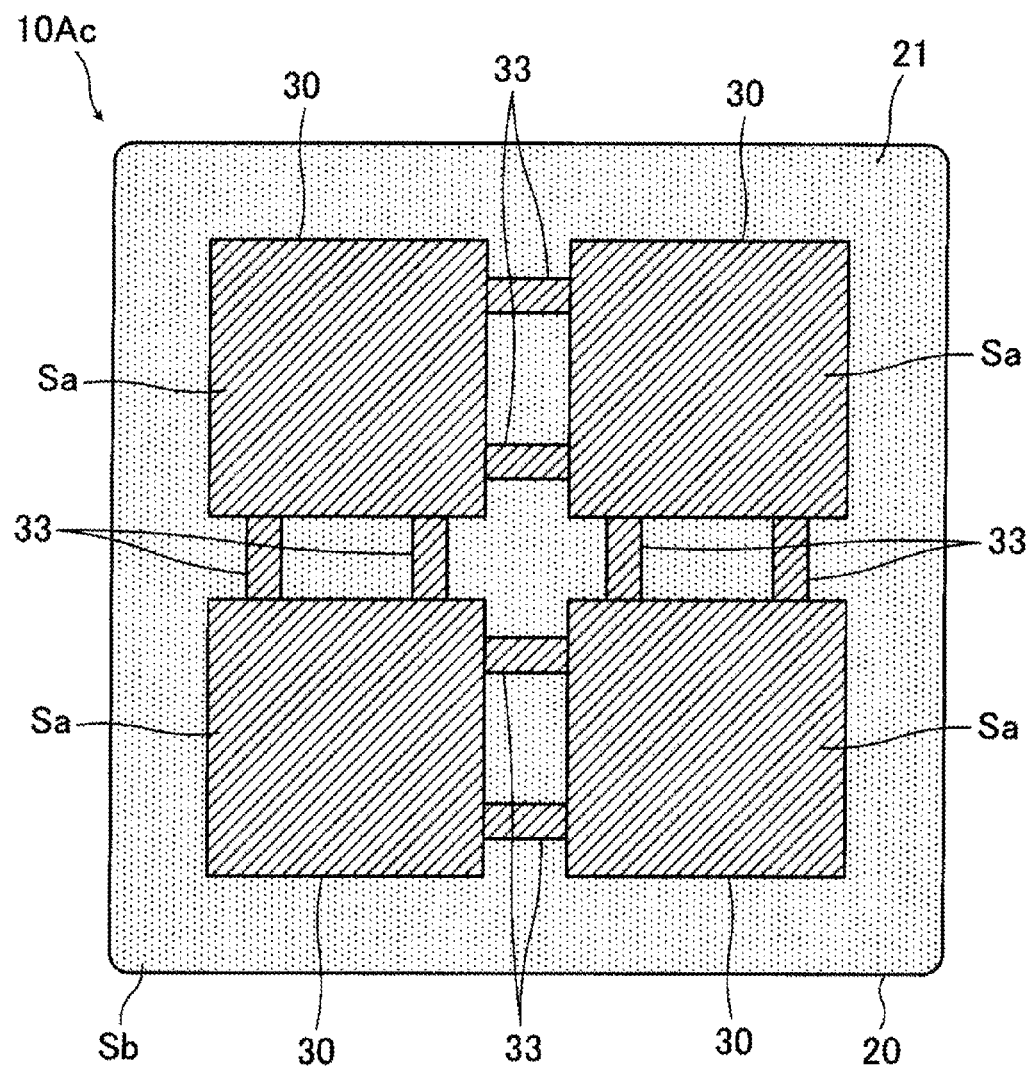
FIG. 8 illustrates a third modification of the heat radiation member according to the first embodiment.

FIG. 8 illustrates a third modification of the heat radiation member according to the first embodiment.

With a heat radiation member 10Ac illustrated in FIG. 8, four copper type members 30 are connected together by tie bars 33. For example, the copper type members 30 connected together in this way by the tie bars 33 can be formed from one copper plate by press work. Alternatively, the copper type members 30 connected together by the tie bars 33 can be formed by connecting tie bars 33 of copper or an alloy of copper to each copper type member 30 by means of diffusion bonding or welding and connecting discrete copper type members 30 together. (In this case, it is not necessary that the tie bars 33 and the copper type members 30 should be equal in thickness.) The heat radiation member 10Ac including the above copper type members 30 can be formed by, for example, die casting, except for preparing the four copper type members 30 connected together by the tie bars 33. This is the same with the above heat radiation member 10A.

The four copper type members 30 are connected together in advance by the tie bars 33. Accordingly, compared with the case where four discrete copper type members 30 are used, handling is easy. The four copper type members 30 can easily be arranged in the block at a proper position in the metal mold 100. In addition, by connecting the four copper type members 30 together in advance by the tie bars 33 of copper or the like, heat can be transferred between different copper type members 30 via tie bars 33. Therefore, temperature distribution in the heat radiation member 10Ac can be made uniform and heat radiation efficiency can be enhanced.

The step 31 illustrated in FIG. 6, the irregularities 32 illustrated in FIG. 7, or both of the step 31 and the irregularities 32 can be formed on the copper type members 30 or the tie bars 33 illustrated in FIG. 8 or both of the copper type members 30 and the tie bars 33.

In addition, one copper type member of larger size may be used in place of the above discrete copper type members 30.

Figure 9:
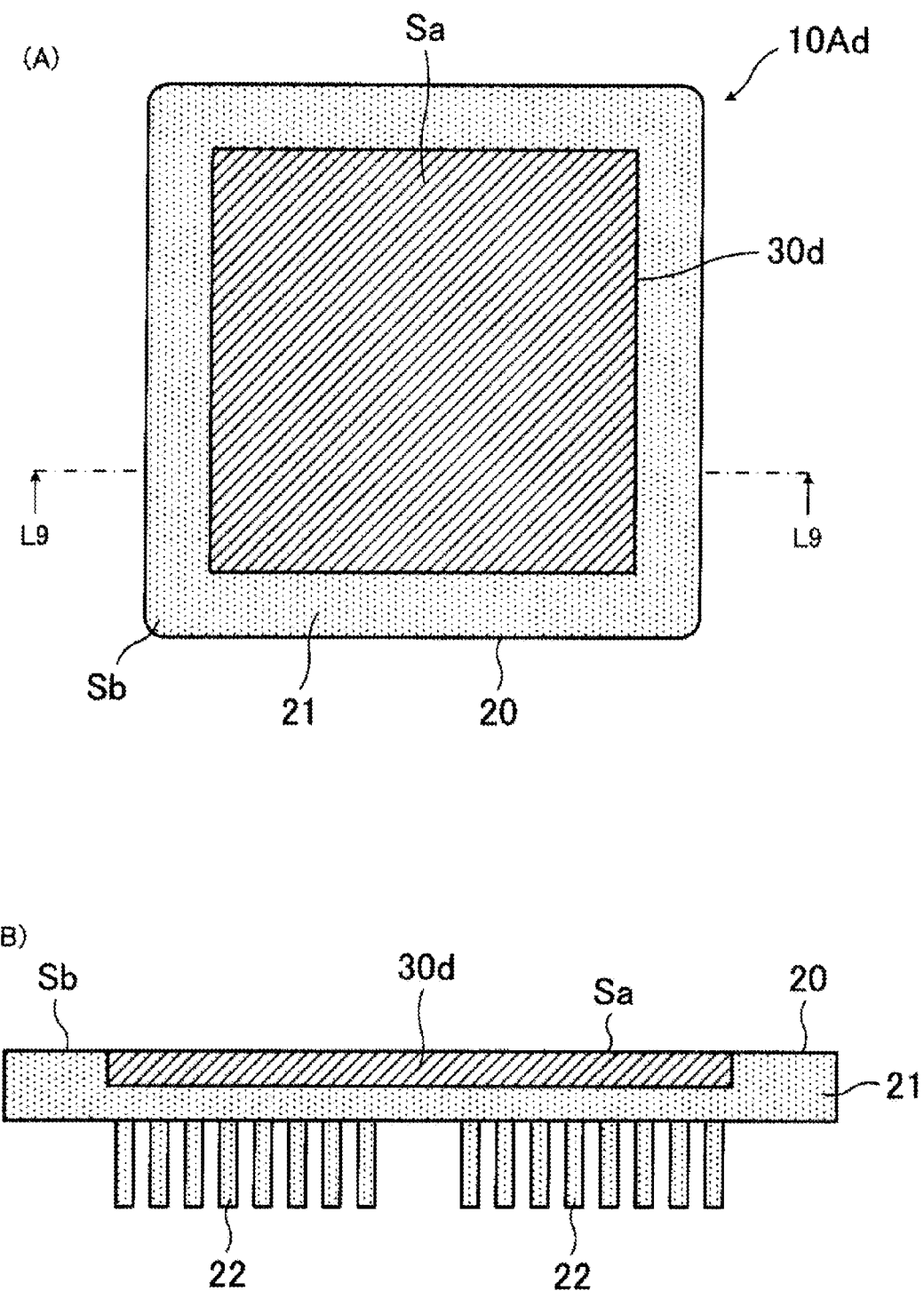
FIG. 9 illustrates a fourth modification of the heat radiation member according to the first embodiment.

FIG. 9 illustrates a fourth modification of the heat radiation member according to the first embodiment. FIG. 9(A) is a schematic plan view of a fourth modification of the heat radiation member according to the first embodiment and FIG. 9(B) is a schematic sectional view taken along the dot-dash line of FIG. 9(A).

With a heat radiation member 10Ad illustrated in FIG. 9, one copper type member 30d is embedded in an aluminum type member 20. A semiconductor module is fabricated by, for example, bonding four semiconductor devices 40 over the one copper type member 30d. This is the same with the above semiconductor module 50A.

By using the one copper type member 30d in this way, handling becomes easy and the one copper type member 30d can easily be arranged in the metal mold 100. Furthermore, temperature distribution in the heat radiation member 10Ad can be made uniform.

The step 31 illustrated in FIG. 6, the irregularities 32 illustrated in FIG. 7, or both of the step 31 and the irregularities 32 can be formed on the copper type member 30d illustrated in FIG. 9.

A second embodiment will now be described.

Figure 10:
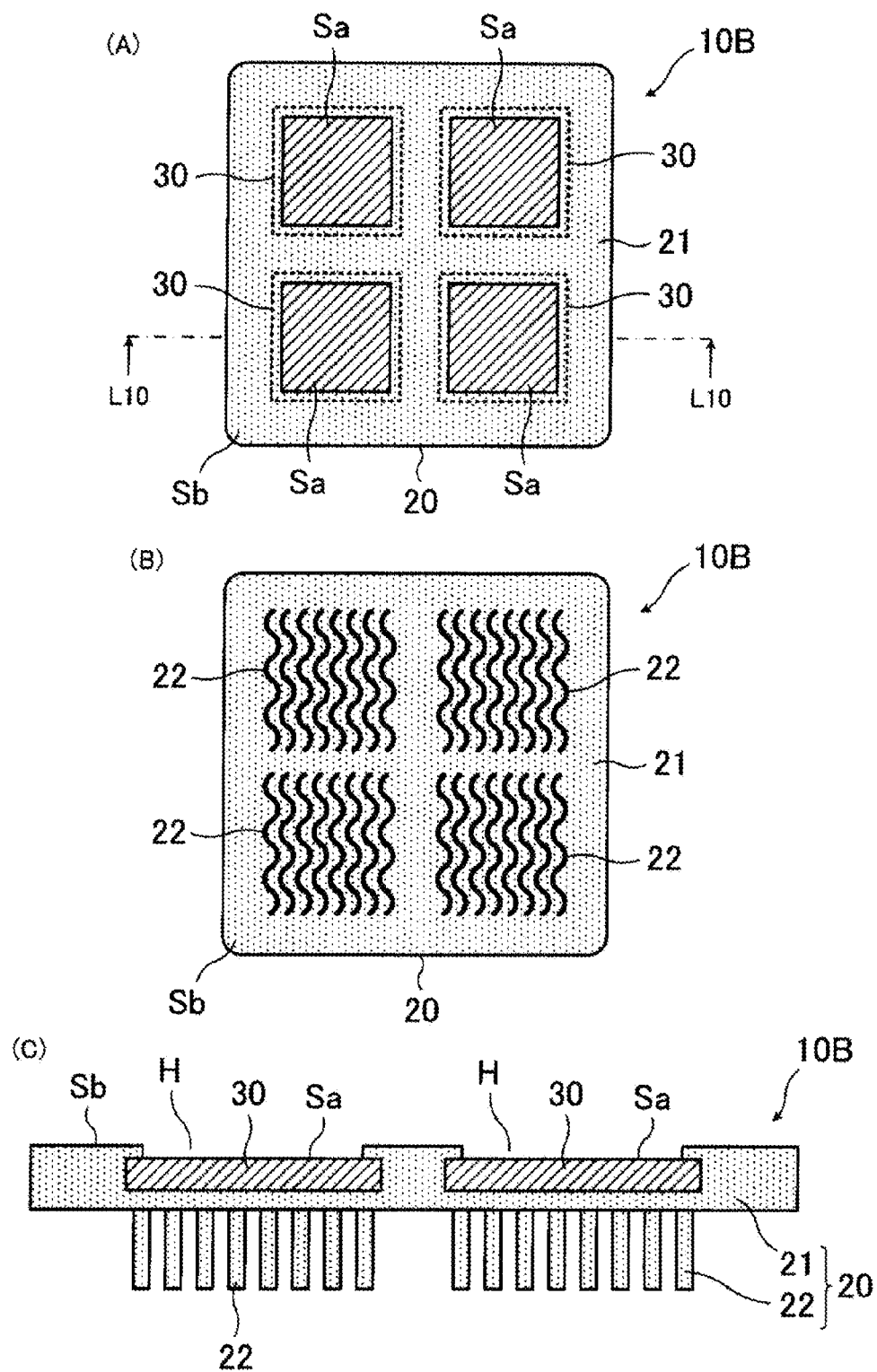
FIG. 10 illustrates an example of a heat radiation member according to a second embodiment.

FIG. 10 illustrates an example of a heat radiation member according to a second embodiment. FIG. 10(A) is a schematic plan view of a heat radiation member from one surface, FIG. 10(B) is a schematic plan view of the heat radiation member from the other surface, and FIG. 10(C) is a schematic sectional view taken along the dot-dash line of FIG. 10(A).

With a heat radiation member 10B illustrated in FIG. 10, four copper type members 30 are embedded in a surface of an aluminum type member 20 (base section 21) opposite to a surface over which fins 22 are arranged. In this case, the four copper type members 30 are embedded below an end Sb of the aluminum type member 20 (base section 21). Edge portions of each copper type member 30 are covered with the aluminum type member 20 (base section 21) and part of a surface Sa of each copper type member 30 is exposed in a cavity H in the aluminum type member 20.

The heat radiation member 10B having the above structure can be formed by die casting. This is the same with the above heat radiation member 10A and the like. In this case, a lower metal mold having a stand portion (corresponding to the cavity H) which holds each copper type member 30 at a level higher than that of the end Sb of the aluminum type member 20 is used. Each copper type member 30 is placed on the stand portion of the lower metal mold and is covered with an upper metal mold. A material in a molten state which contains aluminum or an alloy of aluminum is then forced into a metal mold.

The semiconductor device 40 illustrated in FIG. 4, for example, is thermally bonded to the heat radiation member 10B formed in this way to fabricate a semiconductor module. When the heat radiation member 10B is formed, the number, arrangement, and size (plane size) of the copper type members 30 are set on the basis of the number, arrangement, and size (plane size) of the semiconductor devices 40 used in the semiconductor module. With the heat radiation member 10B according to the second embodiment, the plane size of the surface Sa of each copper type member 30 which is exposed below the end Sb of the aluminum type member 20 should be larger than or equal to the plane size of the semiconductor device 40 (plane size of the board 41, for example) bonded thereover.

Figure 11:
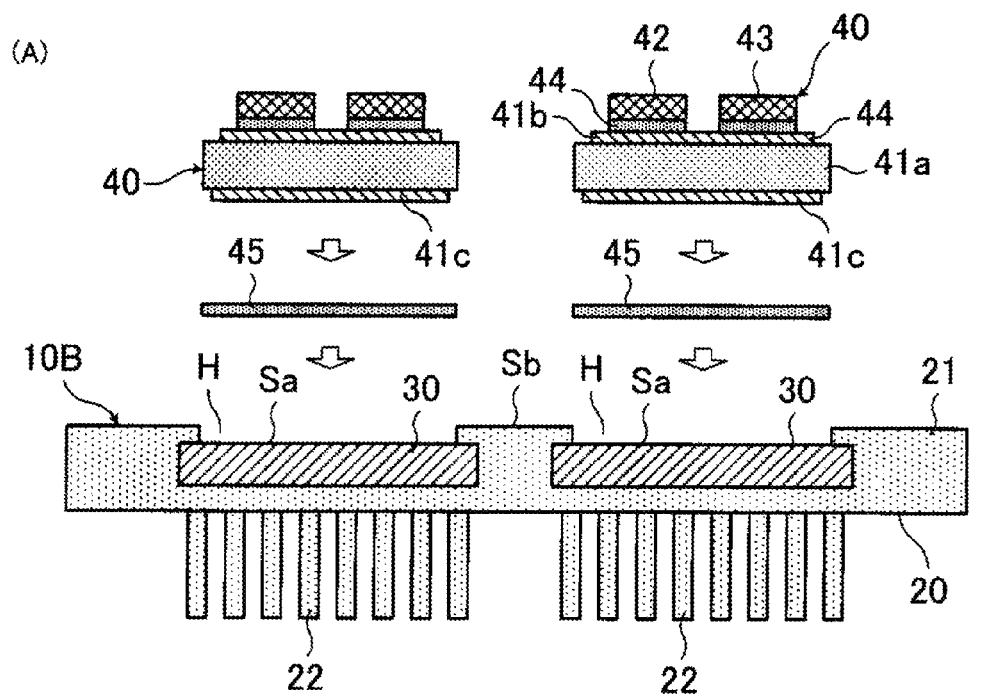
FIG. 11 illustrates an example of a method for fabricating a semiconductor module according to a second embodiment.
Figure 11:
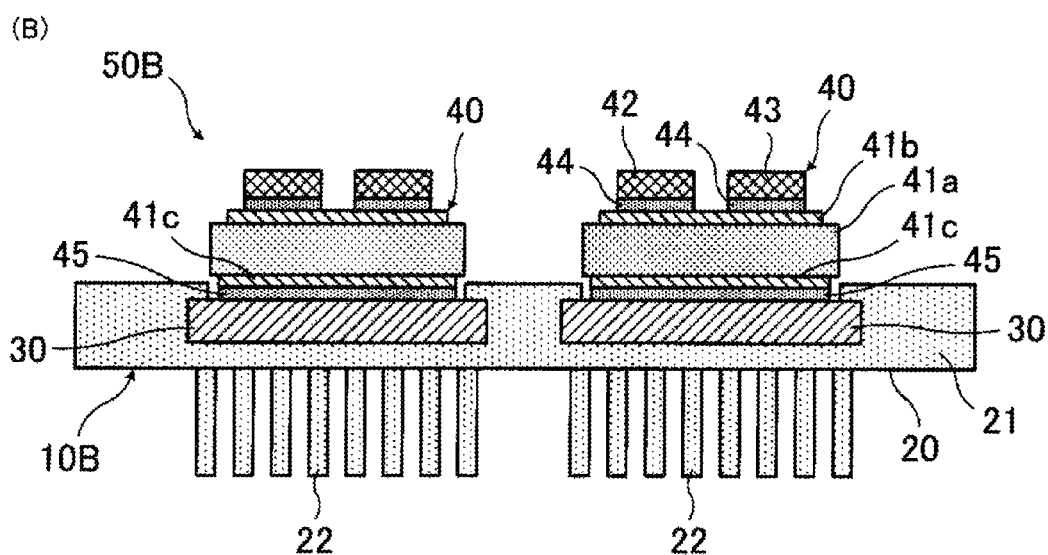

FIG. 11 illustrates an example of a method for fabricating a semiconductor module according to a second embodiment. FIG. 11(A) illustrates a state before bonding and FIG. 11(B) illustrates a state after bonding.

As illustrated in FIG. 11(A), the conductor pattern 41c formed over the surface of the semiconductor device 40 opposite to the surface over which the semiconductor elements 42 and 43 are mounted is bonded over the copper type member 30 of the heat radiation member 10B via a bonding layer 45.

At this time the bonding layer 45 and the semiconductor device 40 should be placed over the surface Sa of the copper type member 30 embedded in the aluminum type member 20 below the end Sb. The plane size of the surface Sa of the copper type member 30 is set to a determined value. Accordingly, the positioning of them can be performed easily and accurately.

The bonding layer 45 is placed over the exposed surface Sa of the copper type member 30 and the semiconductor device 40 is bonded to the copper type member 30 via the bonding layer 45. By doing so, a semiconductor module 50B illustrated in FIG. 11(B) is fabricated.

With the heat radiation member 10B, the sides of the copper type member 30 are enclosed by the aluminum type member 20 and edge portions of the copper type member 30 are covered with the aluminum type member 20. Accordingly, the copper type member 30 is held firmly by the aluminum type member 20. This means that the separation of the copper type member 30 from the aluminum type member 20 can be controlled effectively. As a result, it is possible to make the semiconductor module 50B using the heat radiation member 10B operate stably for a long period of time.

Figure 12:
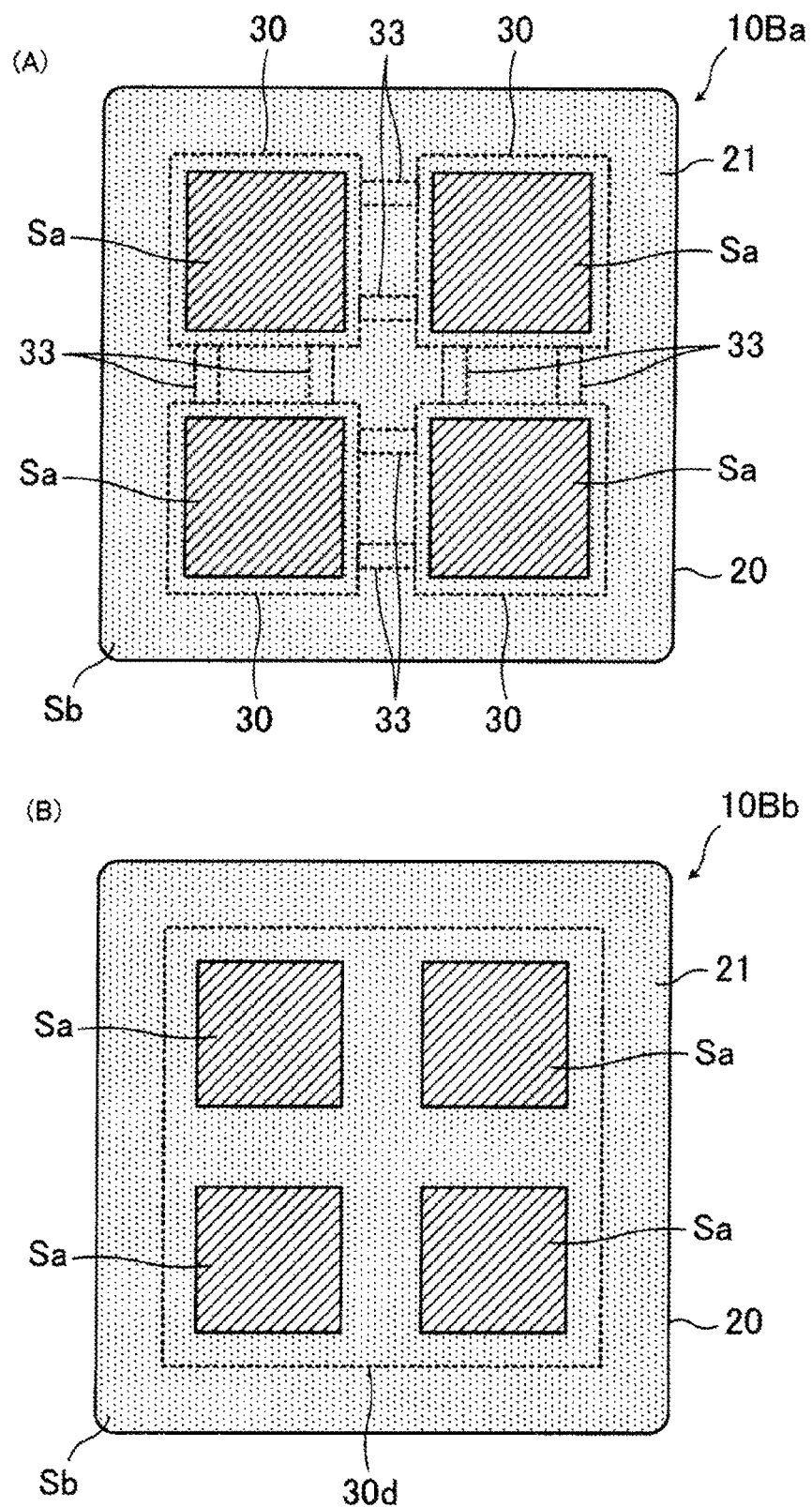
FIG. 12 illustrates modifications of the heat radiation member according to the second embodiment.

In addition, the heat radiation member 10B may have a structure illustrated in FIG. 12.

FIG. 12 illustrates modifications of the heat radiation member according to the second embodiment. FIG. 12(A) illustrates a first modification of the heat radiation member according to the second embodiment and FIG. 12(B) illustrates a second modification of the heat radiation member according to the second embodiment.

With a heat radiation member 10Ba illustrated in FIG. 12(A), four copper type members 30 are connected together by tie bars 33. An exposed surface Sa of each copper type member 30 is below an end Sb of an aluminum type member 20. With the heat radiation member 10Ba edge portions of each copper type member 30 and the tie bars 33 are covered with the aluminum type member 20.

With a heat radiation member 10Bb illustrated in FIG. 12(B), one copper type member 30d of larger size is embedded in an aluminum type member 20. An exposed surface Sa of the copper type member 30d is below an end Sb of the aluminum type member 20. Edge portions of the copper type member 30d and boundary portions by which the surface Sa of the copper type member 30d is divided into quarters are covered with the aluminum type member 20.

By adopting the heat radiation member 10Ba or 10Bb, the copper type members 30 or the copper type member 30d can be handled easily. In addition, temperature distribution in the heat radiation member 10Ba or 10Bb can be made uniform and heat radiation efficiency can be enhanced.

In the above heat radiation member 10B, 10Ba, or 10Bb, irregularities 32 which are the same as those illustrated in FIG. 7 may be formed on all or part of the sides of each copper type member 30, the copper type member 30d, or each tie bar 33 which touch the aluminum type member 20.

A third embodiment will now be described.

Figure 13:
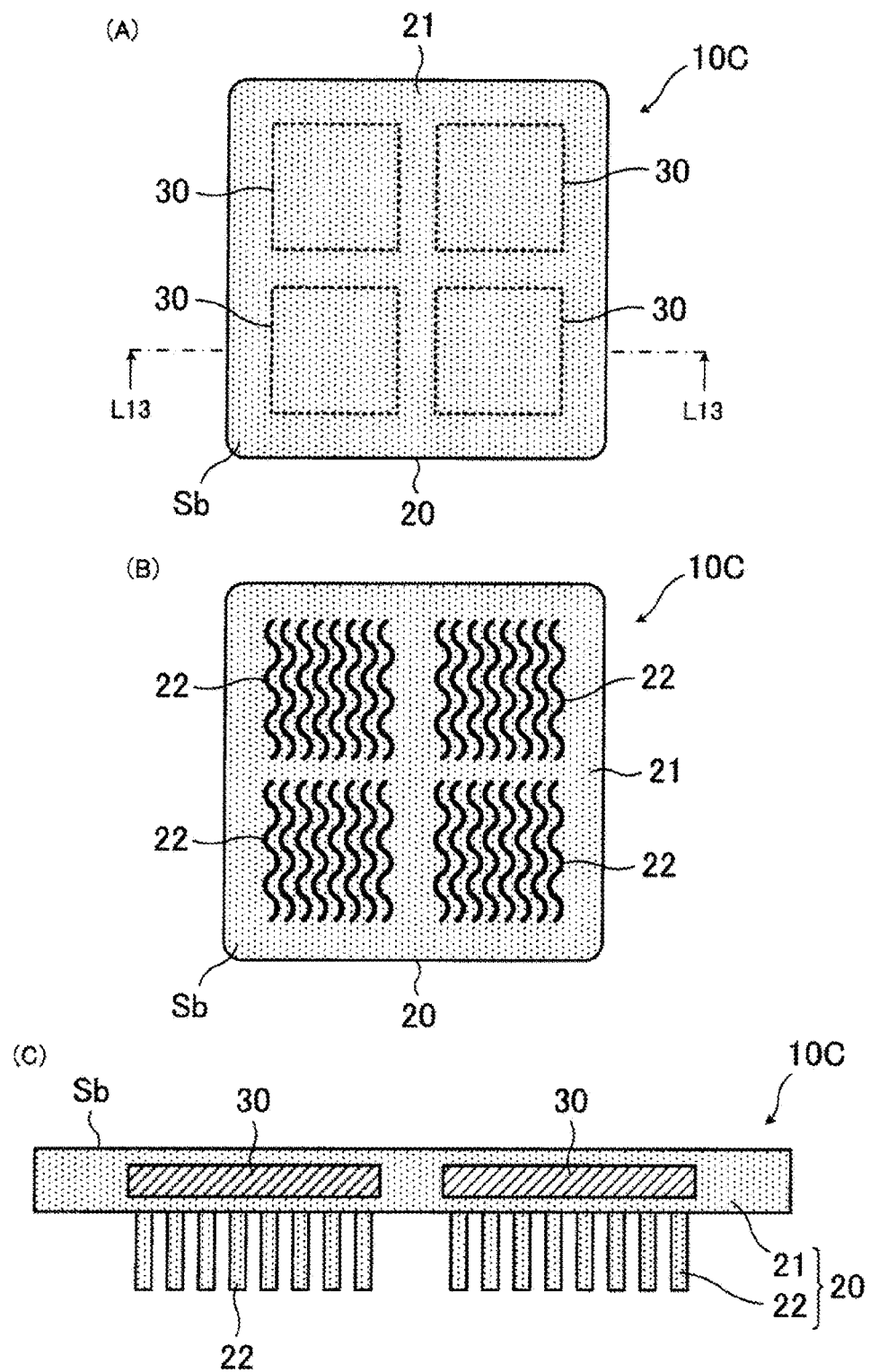
FIG. 13 illustrates an example of a heat radiation member according to a third embodiment.

FIG. 13 illustrates an example of a heat radiation member according to a third embodiment. FIG. 13(A) is a schematic plan view of a heat radiation member from one surface, FIG. 13(B) is a schematic plan view of the heat radiation member from the other surface, and FIG. 13(C) is a schematic sectional view taken along the dot-dash line of FIG. 13(A).

With a heat radiation member 10C illustrated in FIG. 13, four copper type members 30 are embedded within a base section 21 of an aluminum type member 20 and are not exposed.

The heat radiation member 10C having the above structure can be formed by die casting. This is the same with the above heat radiation member 10A and the like. In this case, a lower metal mold having a supporting pin which holds each copper type member 30 at a level higher than that of an end Sb of the aluminum type member 20 is used. Each copper type member 30 is held by the supporting pin and is covered with an upper metal mold. A material in a molten state which contains aluminum or an alloy of aluminum is then forced into a metal mold.

When the heat radiation member 10C is formed, the number, arrangement, and size (plane size) of the copper type members 30 are set on the basis of the number, arrangement, and size (plane size) of the semiconductor devices 40 bonded thereover. For example, the plane size of the copper type members 30 should be larger than or equal to the plane size of the semiconductor device 40 (plane size of the board 41, for example) bonded thereover.

Figure 14:
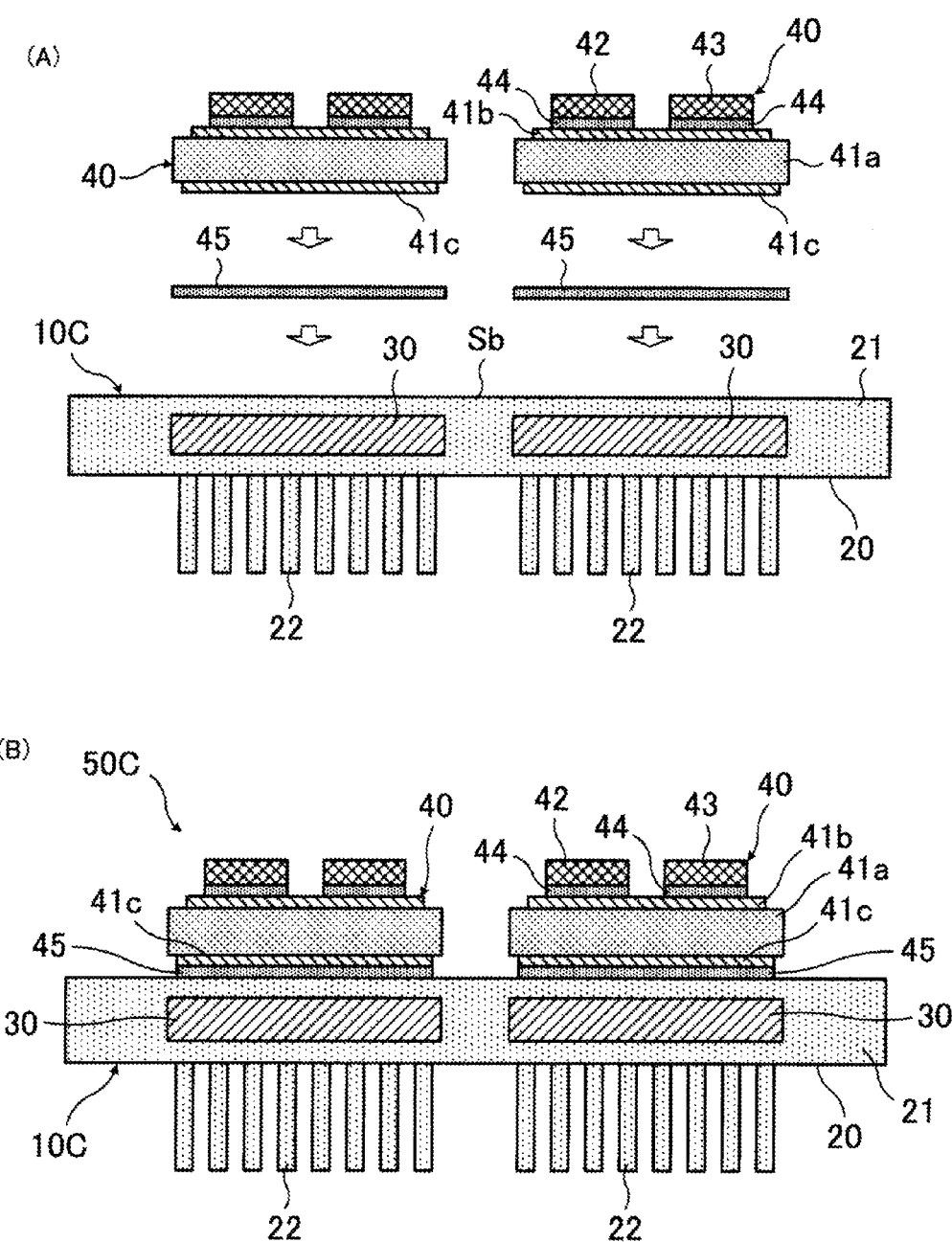
FIG. 14 illustrates an example of a method for fabricating a semiconductor module according to a third embodiment.

FIG. 14 illustrates an example of a method for fabricating a semiconductor module according to a third embodiment.

FIG. 14(A) illustrates a state before bonding and FIG. 14(B) illustrates a state after bonding.

As illustrated in FIG. 14(A), the conductor pattern 41c of the semiconductor device 40 is bonded over the heat radiation member 10C via a bonding layer 45. At this time the bonding layer 45 is placed over the copper type member 30 embedded within the aluminum type member 20. The semiconductor device 40 is bonded to the base section 21 of the aluminum type member 20 via the bonding layer 45. As a result, a semiconductor module 50C illustrated in FIG. 14(B) is fabricated.

With the heat radiation member 10C, the copper type members 30 are embedded within the aluminum type member 20 and are not exposed. Therefore, the separation of the copper type members 30 from the aluminum type member 20 can be controlled. As a result, it is possible to make the semiconductor module 50C using the heat radiation member 10C operate stably for a long period of time.

Figure 15:
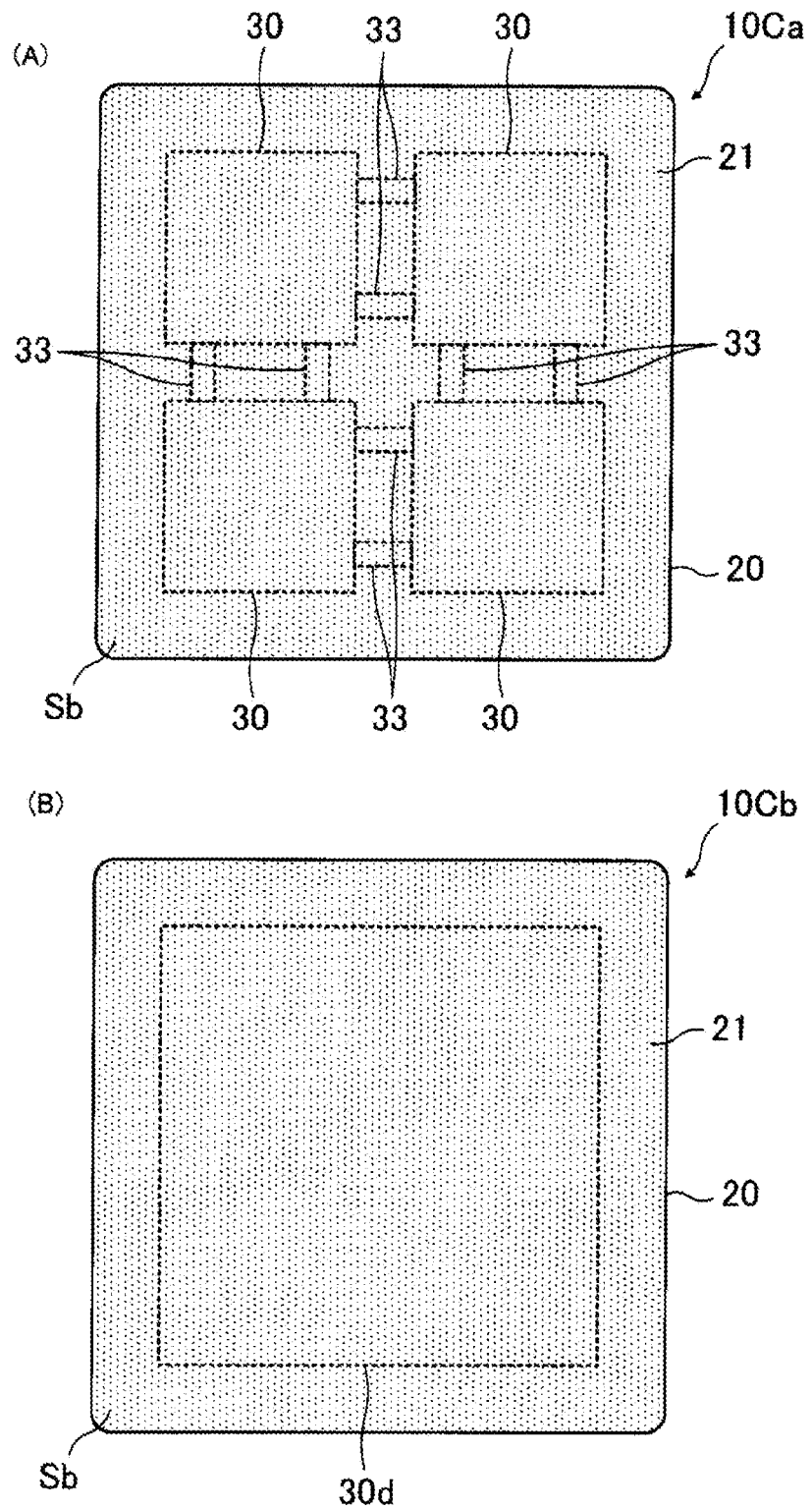
FIG. 15 illustrates modifications of the heat radiation member according to the third embodiment.

In addition, the heat radiation member 10C may have a structure illustrated in FIG. 15.

FIG. 15 illustrates modifications of the heat radiation member according to the third embodiment. FIG. 15(A) illustrates a first modification of the heat radiation member according to the third embodiment and FIG. 15(B) illustrates a second modification of the heat radiation member according to the third embodiment.

With a heat radiation member 10Ca illustrated in FIG. 15(A), four copper type members 30 are connected together by tie bars 33. With a heat radiation member 10Cb illustrated in FIG. 15(B), one copper type member 30d of larger size is embedded within an aluminum type member 20.

By adopting the heat radiation member 10Ca or 10Cb, the copper type members 30 or the copper type member 30d can be handled easily. In addition, temperature distribution in the heat radiation member 10Ca or 10Cb can be made uniform and heat radiation efficiency can be enhanced.

In the above heat radiation member 10C, 10Ca, or 10Cb, irregularities 32 which are the same as those illustrated in FIG. 7 may be formed on all or part of the sides of each copper type member 30, the copper type member 30d, or each tie bar 33 which touch the aluminum type member 20.

A fourth embodiment will now be described.

Figure 16:
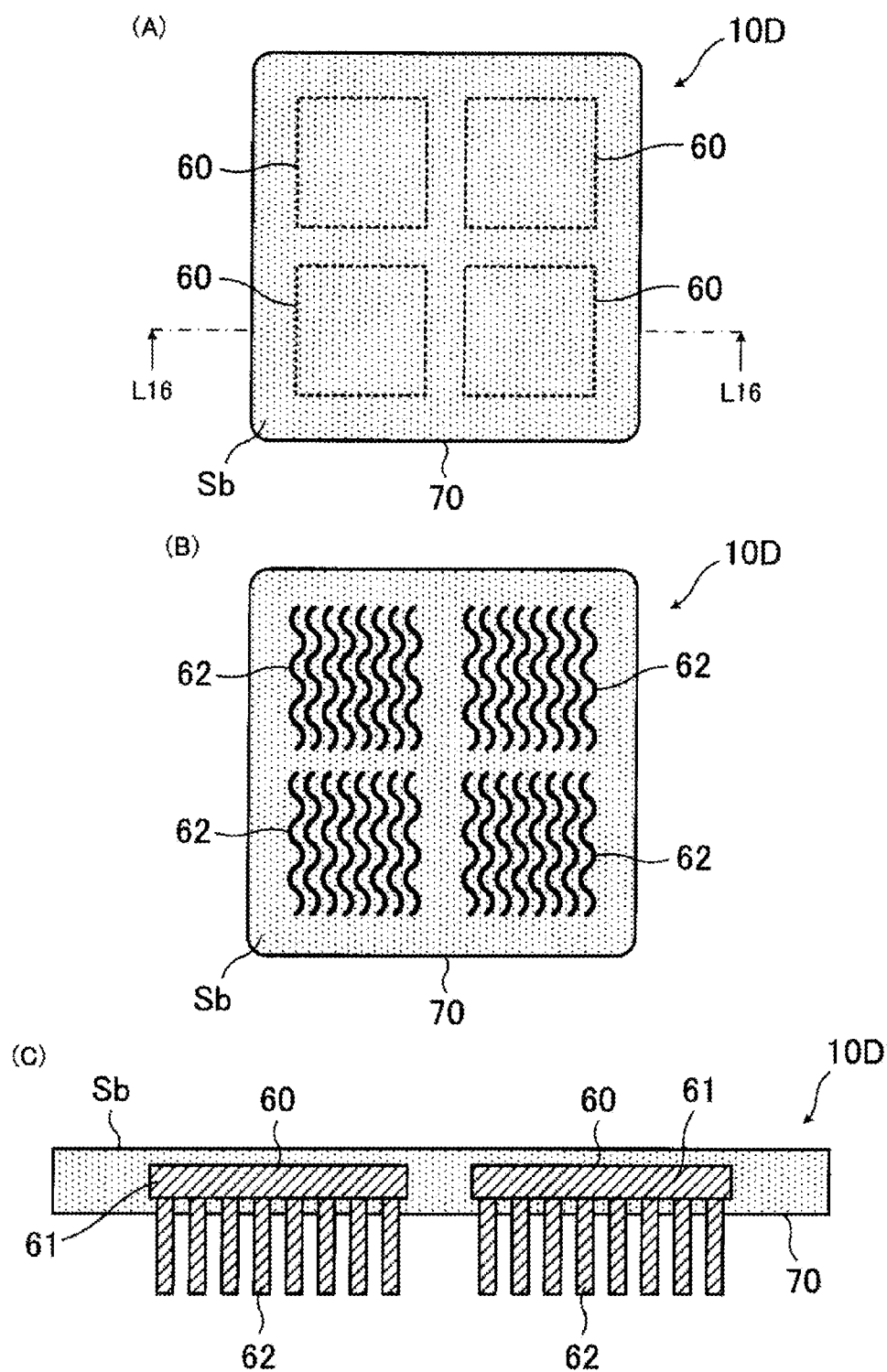
FIG. 16 illustrates an example of a heat radiation member according to a fourth embodiment.

FIG. 16 illustrates an example of a heat radiation member according to a fourth embodiment. FIG. 16(A) is a schematic plan view of a heat radiation member from one surface, FIG. 16(B) is a schematic plan view of the heat radiation member from the other surface, and FIG. 16(C) is a schematic sectional view taken along the dot-dash line of FIG. 16(A).

With a heat radiation member 10D illustrated in FIG. 16, copper type members 60 each including a base section 61 and a plurality of fins 62 arranged on the base section 61 are used. With the heat radiation member 10D, the base section 61 and root portions of the fins 62 included in each of four copper type members 60 are embedded within an aluminum type member 70 not having fins, and tip portions of the fins 62 included in each of the four copper type members 60 protrude from the aluminum type member 70.

The base section 61 and the fins 62 of each copper type member 60 can be formed by the use of copper or an alloy of copper. Plate-like fins, pin-like fins, staggered fins, corrugated fins, or the like may be used as the fins 62 of each copper type member 60 in place of the corrugated-plate-like fins 62 illustrated in FIG. 16(B). This is the same with the aluminum type member 20 illustrated in FIG. 2. The aluminum type member 70 can be formed by the use of aluminum or an alloy of aluminum.

The heat radiation member 10D having the above structure can be formed by die casting. This is the same with the above heat radiation member 10A and the like. In this case, each copper type member 60 including the base section 61 and the fins 62 is formed in advance. Each copper type member 60 can be formed by a method such as extrusion molding or machining. Alternatively, each copper type member 60 may be formed by bonding the fins 62 formed separately from the base section 61 to the plate-like base section 61 by a method such as diffusion bonding or welding. Each copper type member 60 formed in this way is placed in a determined metal mold prepared in advance, and a material in a molten state which contains aluminum or an alloy of aluminum is then forced into the metal mold. By doing so, the above heat radiation member 10D in which the fins 62 of each copper type member 60 protrude from the aluminum type member 70 is formed.

When the heat radiation member 10D is formed, the number, arrangement, and size (plane size) of the copper type members 60 are set on the basis of the number, arrangement, and size (plane size) of the semiconductor devices 40 bonded thereover. For example, the plane size of the copper type members 60 should be larger than or equal to the plane size of the semiconductor device 40 (plane size of the board 41, for example) bonded thereover.

Figure 17:
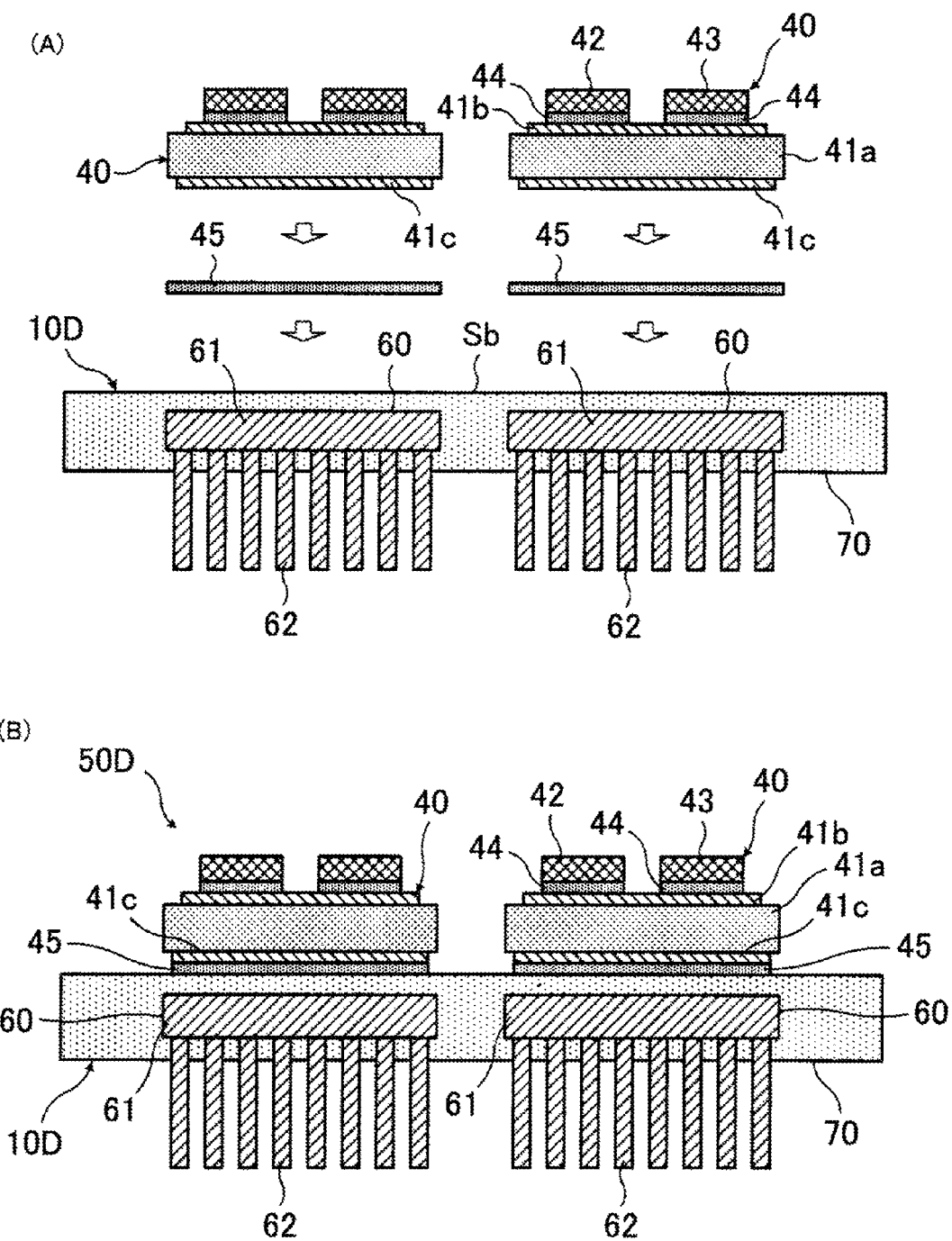
FIG. 17 illustrates an example of a method for fabricating a semiconductor module according to a fourth embodiment.

FIG. 17 illustrates an example of a method for fabricating a semiconductor module according to a fourth embodiment. FIG. 17(A) illustrates a state before bonding and FIG. 17(B) illustrates a state after bonding.

As illustrated in FIG. 17(A), the conductor pattern 41c of the semiconductor device 40 is bonded over the heat radiation member 10D via a bonding layer 45. At this time the bonding layer 45 is placed over the base section 61 of the copper type member 60 embedded within the aluminum type member 70. The semiconductor device 40 is bonded to the aluminum type member 70 via the bonding layer 45. As a result, a semiconductor module 50D illustrated in FIG. 17(B) is fabricated.

With the heat radiation member 10D, heat generated by the semiconductor device 40, transferred to the aluminum type member 70, and transferred to the base section 61 of the copper type member 60 embedded within the aluminum type member 70 can be radiated efficiently by the fins 62 which protrude from the aluminum type member 70. In addition, the copper type member 60 is embedded in the aluminum type member 70, so the separation of the copper type members 60 from the aluminum type member 70 can be controlled. As a result, it is possible to make the semiconductor module 50D using the heat radiation member 10D operate stably for a long period of time.

Figure 18:
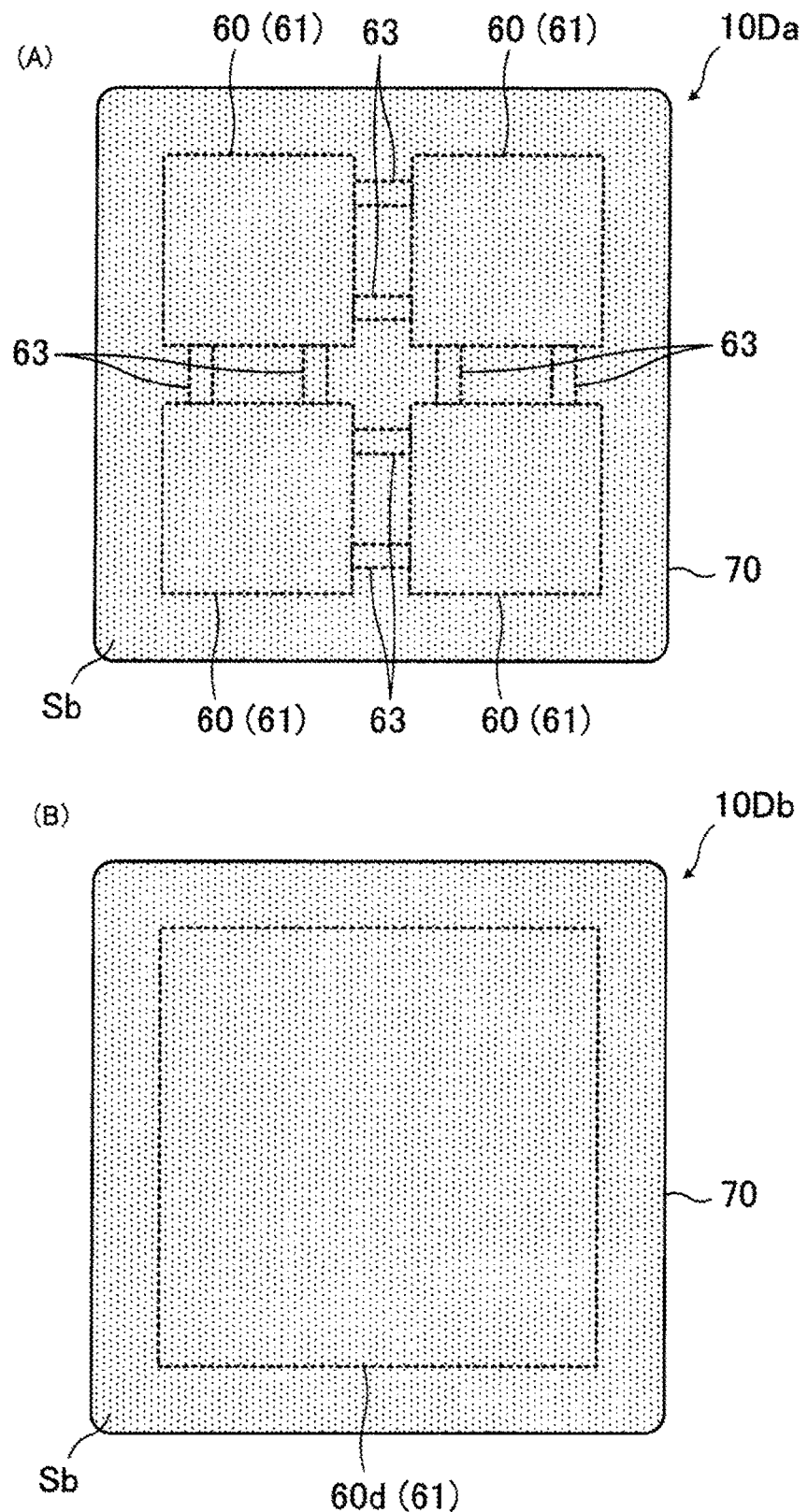
FIG. 18 illustrates modifications of the heat radiation member according to the fourth embodiment.

Furthermore, the heat radiation member 10D may have a structure illustrated in FIG. 18.

FIG. 18 illustrates modifications of the heat radiation member according to the fourth embodiment. FIG. 18(A) illustrates a first modification of the heat radiation member according to the fourth embodiment and FIG. 18(B) illustrates a second modification of the heat radiation member according to the fourth embodiment.

With a heat radiation member 10Da illustrated in FIG. 18(A), different copper type members 60 (base sections 61 on which fins 62 are arranged) are connected together by tie bars 63. With a heat radiation member 10Db illustrated in FIG. 18(B), a copper type member 60d including a base section 61 of larger size on which fins 62 are arranged is used.

By adopting the heat radiation member 10Da or 10Db, the copper type members 60 or the copper type member 60d can be handled easily. In addition, temperature distribution in the heat radiation member 10Da or 10Db can be made uniform and heat radiation efficiency can be enhanced.

In the above heat radiation member 10D, 10Da, or 10Db, irregularities 32 which are the same as those illustrated in FIG. 7 may be formed on all or part of the sides of each copper type member 60, the copper type member 60d, or each tie bar 63 which touch the aluminum type member 70.

A fifth embodiment will now be described.

Figure 19:
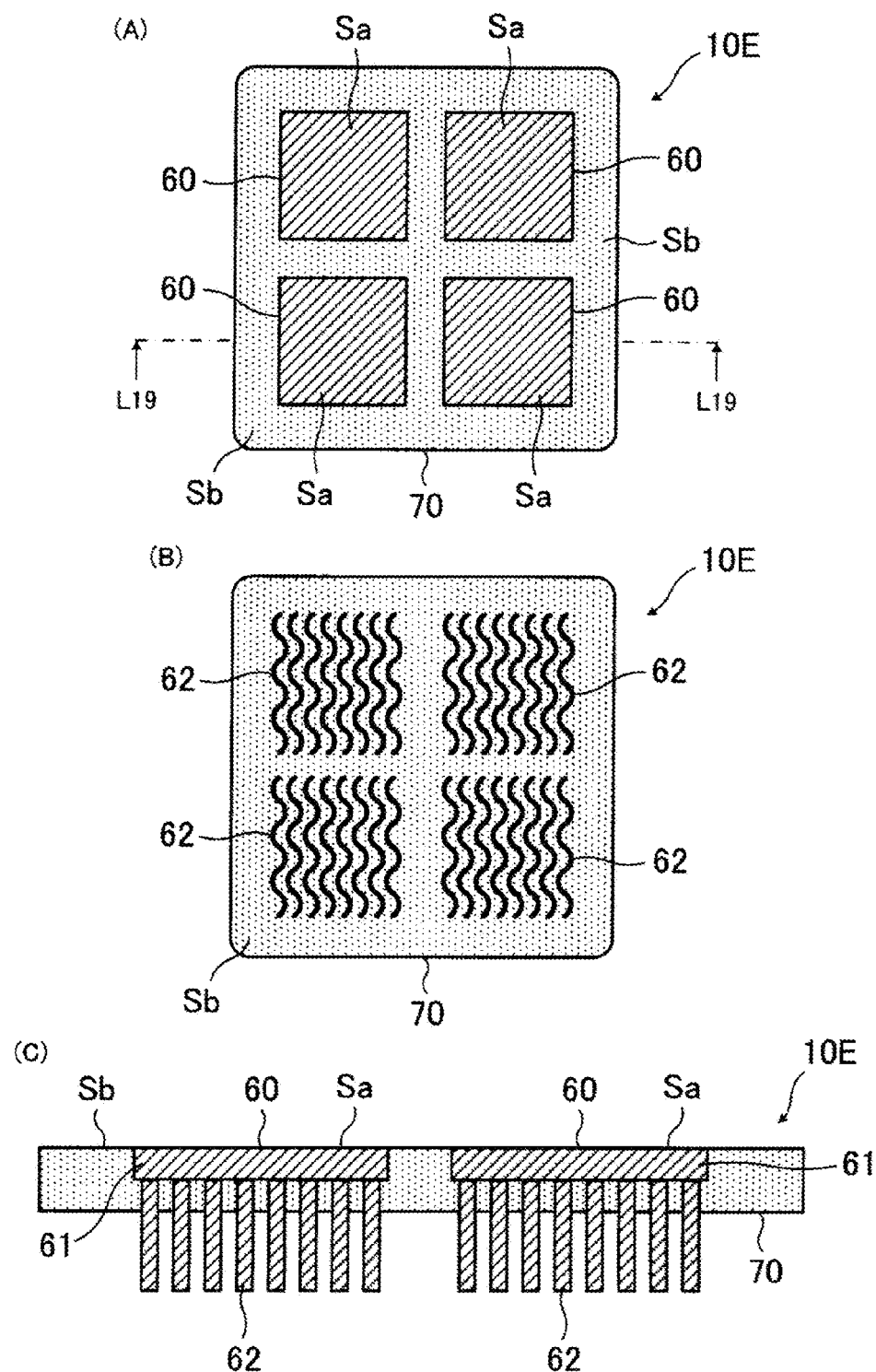
FIG. 19 illustrates an example of a heat radiation member according to a fifth embodiment.

FIG. 19 illustrates an example of a heat radiation member according to a fifth embodiment. FIG. 19(A) is a schematic plan view of a heat radiation member from one surface, FIG. 19(B) is a schematic plan view of the heat radiation member from the other surface, and FIG. 19(C) is a schematic sectional view taken along the dot-dash line of FIG. 19(A).

With a heat radiation member 10E illustrated in FIG. 19, each copper type member 60 includes a base section 61 and a plurality of fins 62 and a surface of each copper type member 60 opposite to a surface on which the plurality of fins 62 are arranged is exposed from an aluminum type member 70. An exposed surface Sa of the base section 61 of each copper type member 60 and an end Sb of the aluminum type member 70 are equal in level.

Each copper type member 60 including the base section 61 and the fins 62 is formed in advance. This is the same with the above heat radiation member 10D according to the fourth embodiment. The aluminum type member 70 is formed by die casting so that tip portions of the fins 62 will protrude from the aluminum type member 70. By doing so, the heat radiation member 10E having the above structure is obtained.

When the heat radiation member 10E is formed, the number, arrangement, and size (plane size) of the copper type members 60 are set on the basis of the number, arrangement, and size (plane size) of the semiconductor devices 40 bonded thereover. For example, the plane size of the copper type members 60 should be larger than or equal to the plane size of the semiconductor device 40 (plane size of the board 41, for example) bonded thereover.

Figure 20:
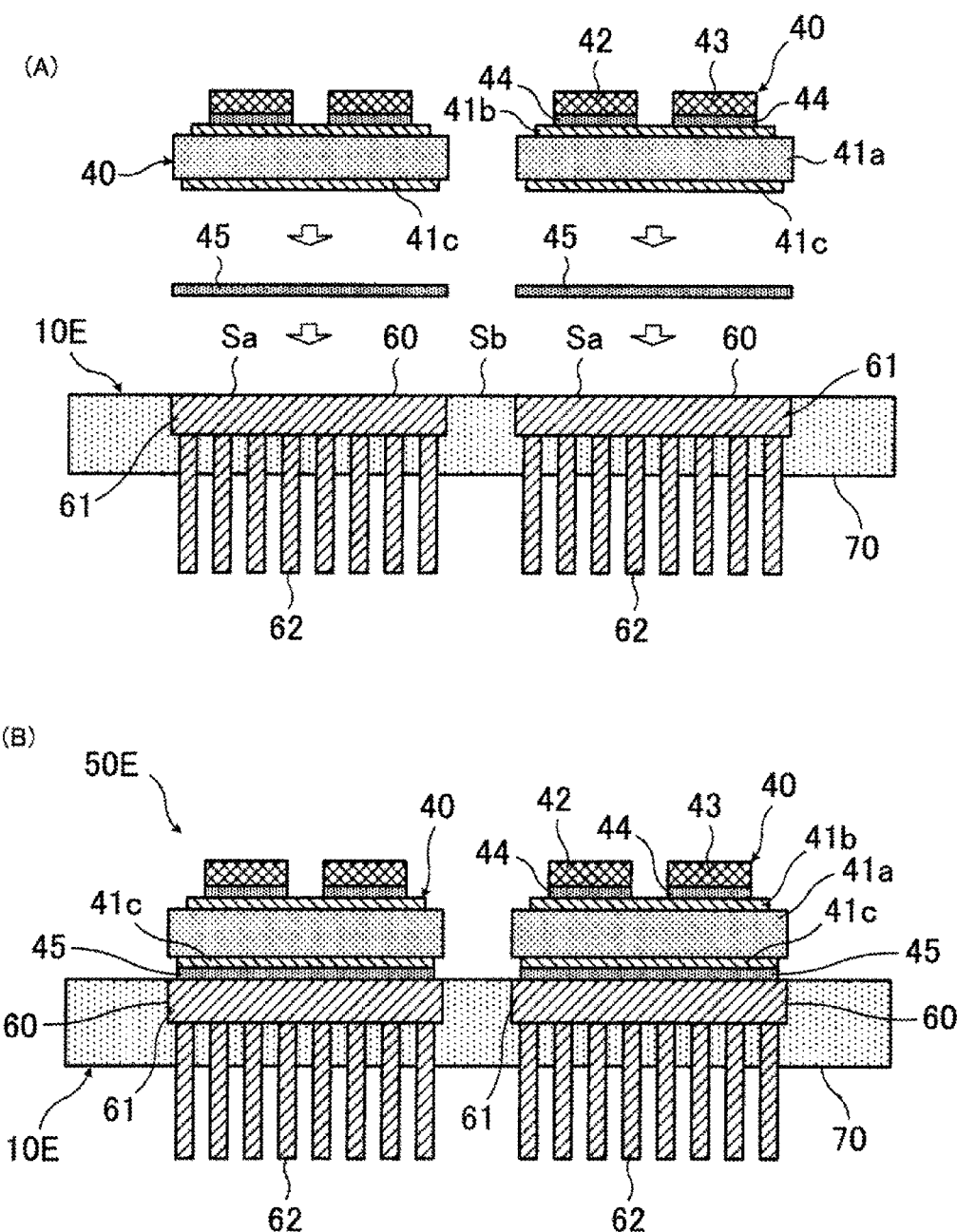
FIG. 20 illustrates an example of a method for fabricating a semiconductor module according to a fifth embodiment.

FIG. 20 illustrates an example of a method for fabricating a semiconductor module according to a fifth embodiment. FIG. 20(A) illustrates a state before bonding and FIG. 20(B) illustrates a state after bonding.

As illustrated in FIG. 20(A), the conductor pattern 41c of the semiconductor device 40 is bonded over the heat radiation member 10E via a bonding layer 45. At this time the bonding layer 45 is placed over the base section 61 of the copper type member 60 (over the exposed surface Sa). The semiconductor device 40 is bonded to the base section 61 via the bonding layer 45. As a result, a semiconductor module 50E illustrated in FIG. 20(B) is fabricated.

With the heat radiation member 10E, heat generated by the semiconductor device 40 is transferred efficiently to the base section 61 of the copper type member 60 and is radiated efficiently from the fins 62 of the copper type member 60 which extrude to the outside. Therefore, by using the heat radiation member 10E in the semiconductor module 50E, high heat radiation efficiency can be secured.

With the heat radiation member 10E, the sides of each copper type member 60 are enclosed by the aluminum type member 70, so each copper type member 60 is held firmly by the aluminum type member 70. This means that the separation of the copper type member 60 from the aluminum type member 70 can be controlled effectively. As a result, it is possible to make the semiconductor module 50E using the heat radiation member 10E operate stably for a long period of time.

Figure 21:
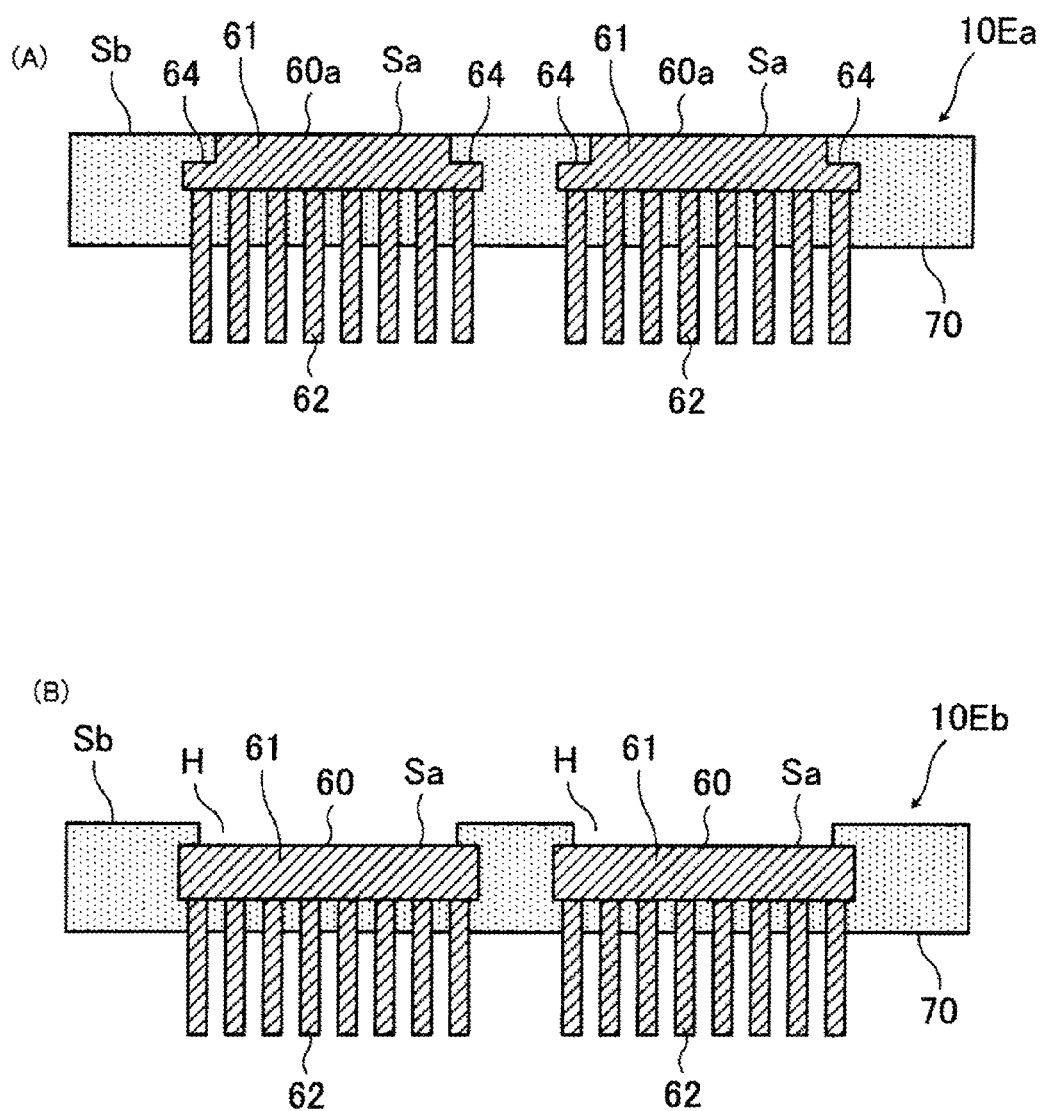
FIG. 21 illustrates modifications of the heat radiation member according to the fifth embodiment (part 1).
Figure 22:
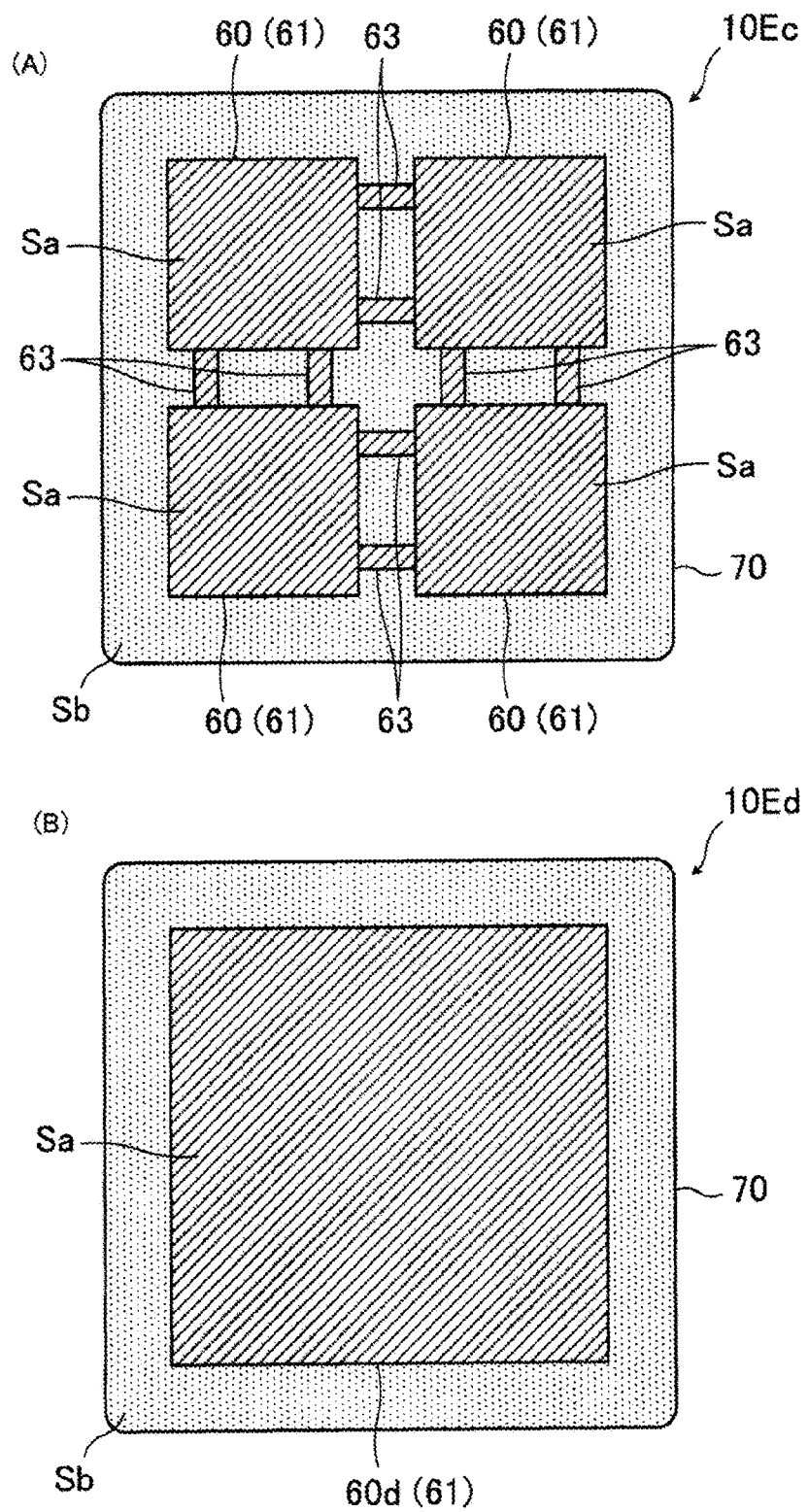
FIG. 22 illustrates modifications of the heat radiation member according to the fifth embodiment (part 2).

In addition, the heat radiation member 10E may have a structure illustrated in FIG. 21 or 22.

FIG. 21 illustrates modifications of the heat radiation member according to the fifth embodiment. FIG. 21(A) illustrates a first modification of the heat radiation member according to the fifth embodiment and FIG. 21(B) illustrates a second modification of the heat radiation member according to the fifth embodiment.

A step 64 is formed at each edge portion of a base section 61 of a copper type member 60a used in a heat radiation member 10Ea illustrated in FIG. 21(A). An exposed surface Sa of the copper type member 60a and an end Sb of an aluminum type member 70 are equal in level. The step 64 is covered with the aluminum type member 70. As a result, the copper type member 60a is held firmly by the aluminum type member 70, so the separation of the copper type member 60a from the aluminum type member 70 can be controlled effectively.

With a heat radiation member 10Eb illustrated in FIG. 21(B), a cavity H is formed in an end Sb of an aluminum type member 70 and a surface Sa of a base section 61 of a copper type member 60 is exposed in the cavity H. Each edge portion of the base section 61 is covered with the aluminum type member 70. As a result, the copper type member 60 is held firmly by the aluminum type member 70, so the separation of the copper type member 60 from the aluminum type member 70 can be controlled effectively. In addition, by forming the cavity H in aluminum type member 70, the semiconductor device 40 can be bonded easily and accurately.

FIG. 22 illustrates modifications of the heat radiation member according to the fifth embodiment. FIG. 22(A) illustrates a third modification of the heat radiation member according to the fifth embodiment and FIG. 22(B) illustrates a fourth modification of the heat radiation member according to the fifth embodiment.

With a heat radiation member 10Ec illustrated in FIG. 22(A), different copper type members 60 (base sections 61 on which fins 62 are arranged) are connected together by tie bars 63. With a heat radiation member 10Ed illustrated in FIG. 22(B), a copper type member 60d including a base section 61 of larger size on which fins 62 are arranged is used.

By adopting the heat radiation member 10Ec or 10Ed, the copper type members 60 or the copper type member 60d can be handled easily. In addition, temperature distribution in the heat radiation member 10Ec or 10Ed can be made uniform and heat radiation efficiency can be enhanced.

The step 64 illustrated in FIG. 21(A) may be formed in each copper type member 60 or each tie bar 63 illustrated in FIG. 22(A) or in the copper type member 60d illustrated in FIG. 22(B).

In the above heat radiation member 10E, 10Ea, 10Eb, 10Ec, or 10Ed irregularities 32 which are the same as those illustrated in FIG. 7 may be formed on all or part of the sides of each copper type member 60, each copper type member 60a, the copper type member 60d, or each tie bar 63 which touch the aluminum type member 70.

A sixth embodiment will now be described.

Figure 23:
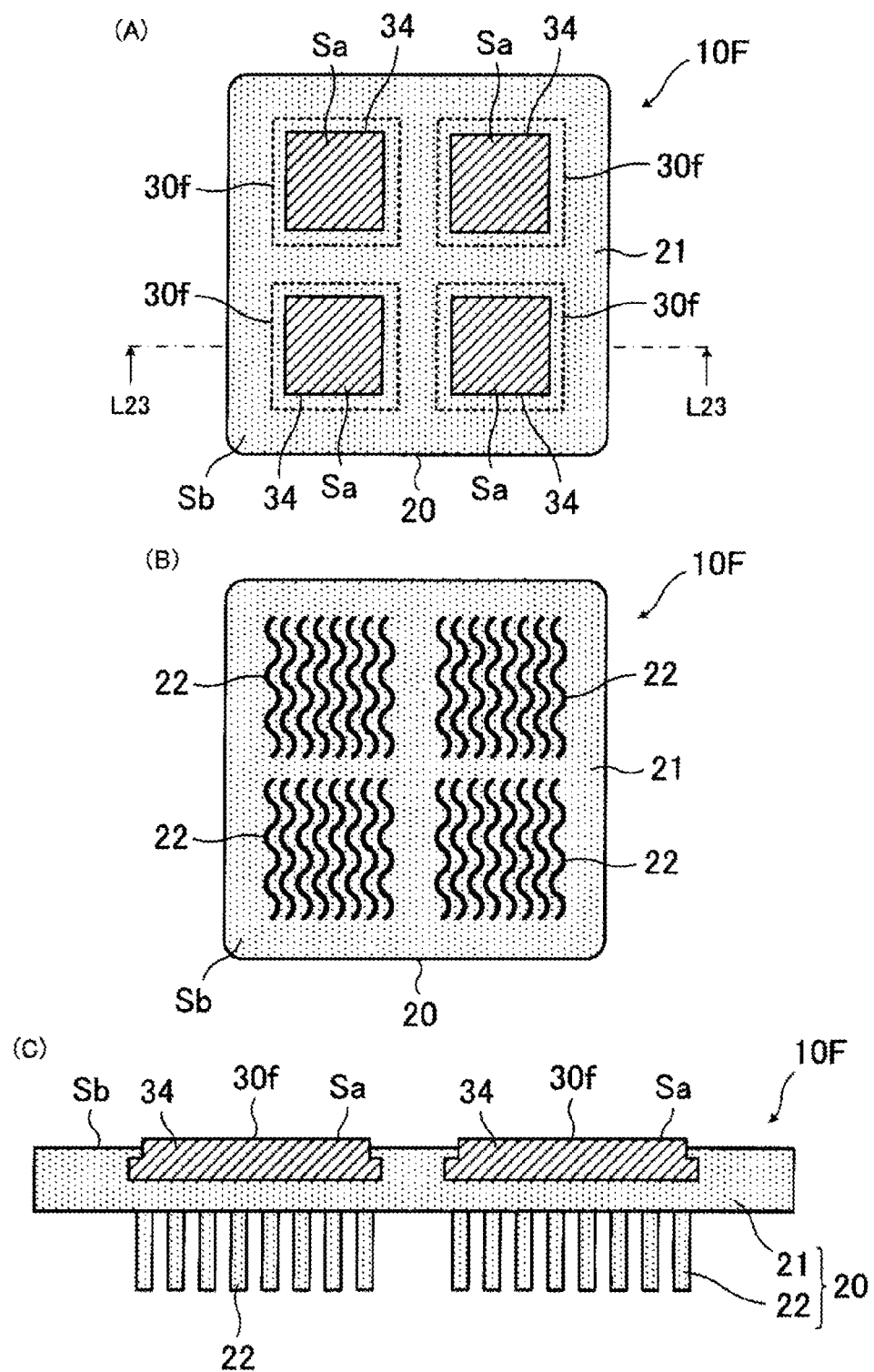
FIG. 23 illustrates an example of a heat radiation member according to a sixth embodiment.

FIG. 23 illustrates an example of a heat radiation member according to a sixth embodiment. FIG. 23(A) is a schematic plan view of a heat radiation member from one surface, FIG. 23(B) is a schematic plan view of the heat radiation member from the other surface, and FIG. 23(C) is a schematic sectional view taken along the dot-dash line of FIG. 23(A).

With a heat radiation member 10F illustrated in FIG. 23, copper type members 30f each having a protrusion 34 in an area in which the semiconductor device 40 is bonded are used. Each copper type member 30f is covered with a base section 21 of an aluminum type member 20 so that a surface Sa of the protrusion 34 will be exposed. The protrusion 34 protrudes from an end Sb of the base section 21 of the aluminum type member 20. Fins 22 are arranged over a surface of the base section 21 of the aluminum type member 20 opposite to the exposed surface Sa of each copper type member 30f.

The heat radiation member 10F having the above structure can be formed by die casting. When the heat radiation member 10F is formed, the number, arrangement, and size (plane size) of the copper type members 30f are set on the basis of the number, arrangement, and size (plane size) of the semiconductor devices 40 bonded thereover. For example, the plane size of the exposed surface Sa of each copper type member 30f should be larger than or equal to the plane size of the semiconductor device 40 (plane size of the board 41, for example) bonded thereover.

Figure 24:
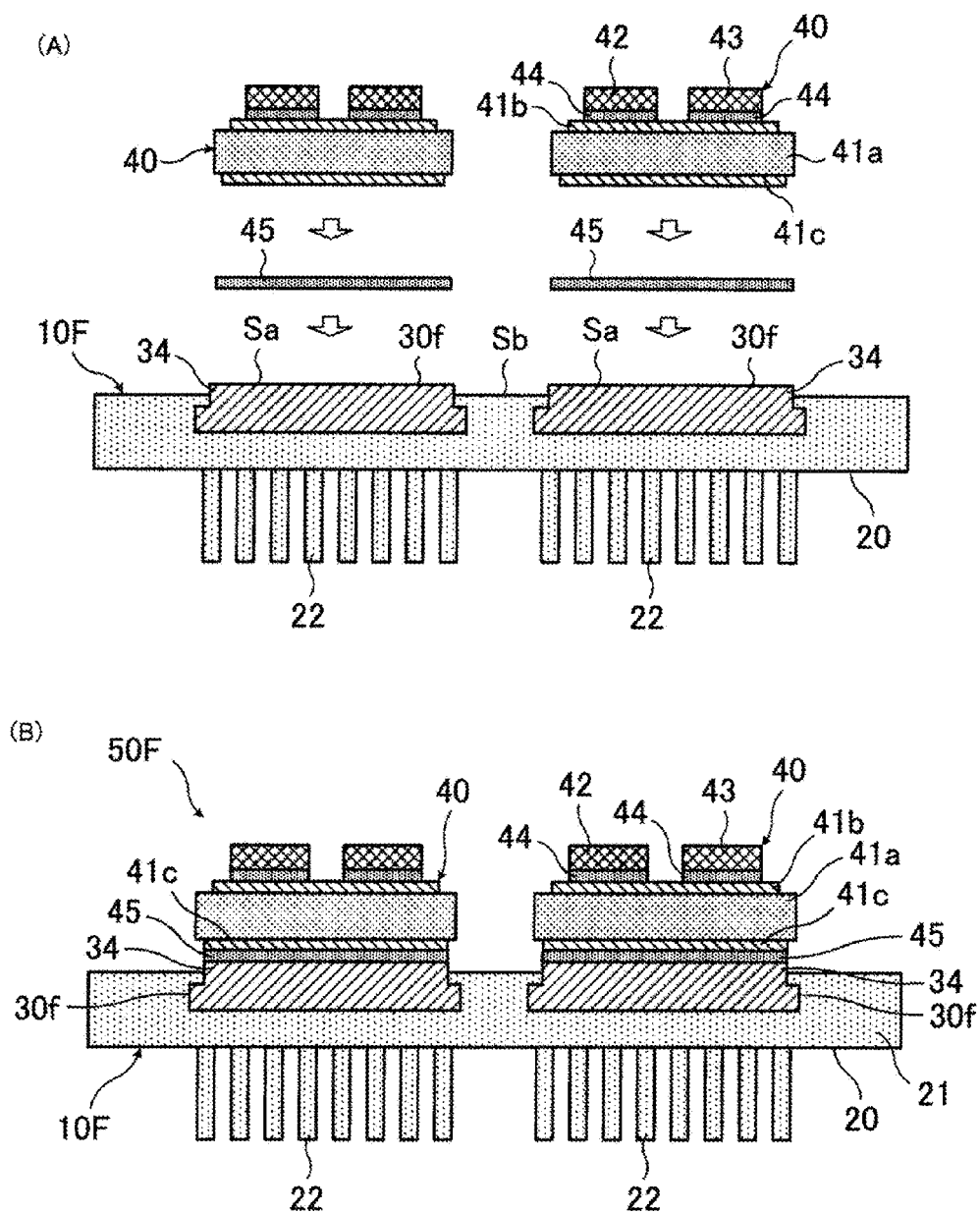
FIG. 24 illustrates an example of a method for fabricating a semiconductor module according to a sixth embodiment.

FIG. 24 illustrates an example of a method for fabricating a semiconductor module according to a sixth embodiment. FIG. 24(A) illustrates a state before bonding and FIG. 24(B) illustrates a state after bonding.

As illustrated in FIG. 24(A), the conductor pattern 41c of the semiconductor device 40 is bonded over the heat radiation member 10F via a bonding layer 45. By doing so, a semiconductor module 50F illustrated in FIG. 24(B) is fabricated.

When the semiconductor device 40 is bonded over the heat radiation member 10F according to the sixth embodiment, the semiconductor device 40 should be placed over the surface Sa which is exposed from the aluminum type member 20 with a bonding layer 45 between. As a result, the positioning of the semiconductor device 40, the bonding layer 45, and the heat radiation member 10F can be performed easily and accurately. When the semiconductor device 40 is bonded over the heat radiation member 10F, the following method may be used. Treatment for selectively raising the solder wettability of the exposed surface Sa or treatment for lowering the solder wettability of the end Sb of the aluminum type member 20 from which the surface Sa is exposed is performed, the solder bonding layer 45 is formed over the surface Sa, and the semiconductor device 40 is placed over the solder bonding layer 45.

In addition, with the heat radiation member 10F the sides of each copper type member 30f are enclosed by the aluminum type member 20. Therefore, each copper type member 30f is held firmly by the aluminum type member 20. This means that the separation of the copper type member 30f from the aluminum type member 20 can be controlled effectively. As a result, it is possible to make the semiconductor module 50F using the heat radiation member 10F operate stably for a long period of time.

Figure 25:
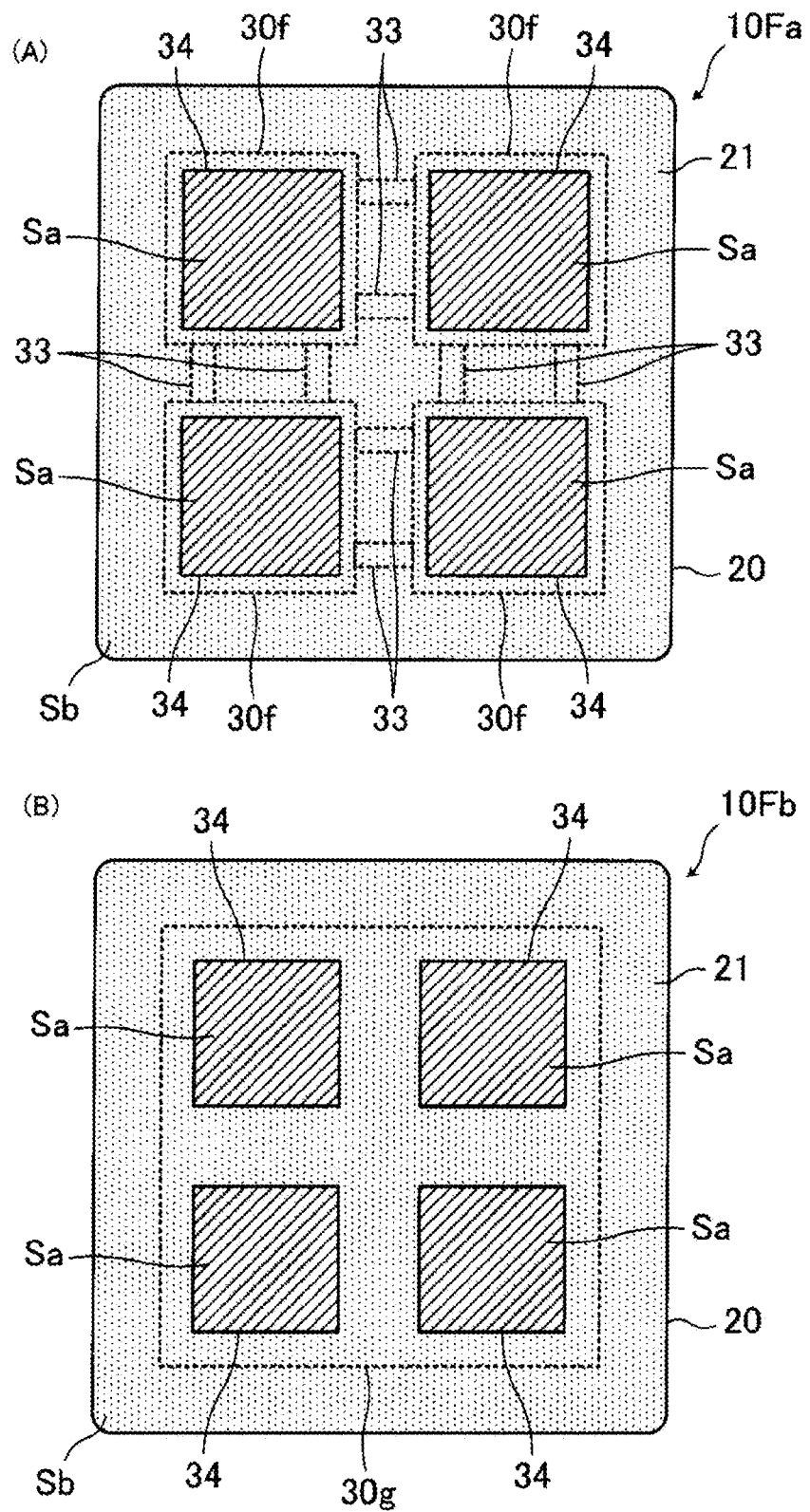
FIG. 25 illustrates modifications of the heat radiation member according to the sixth embodiment (part 1).
Figure 26:
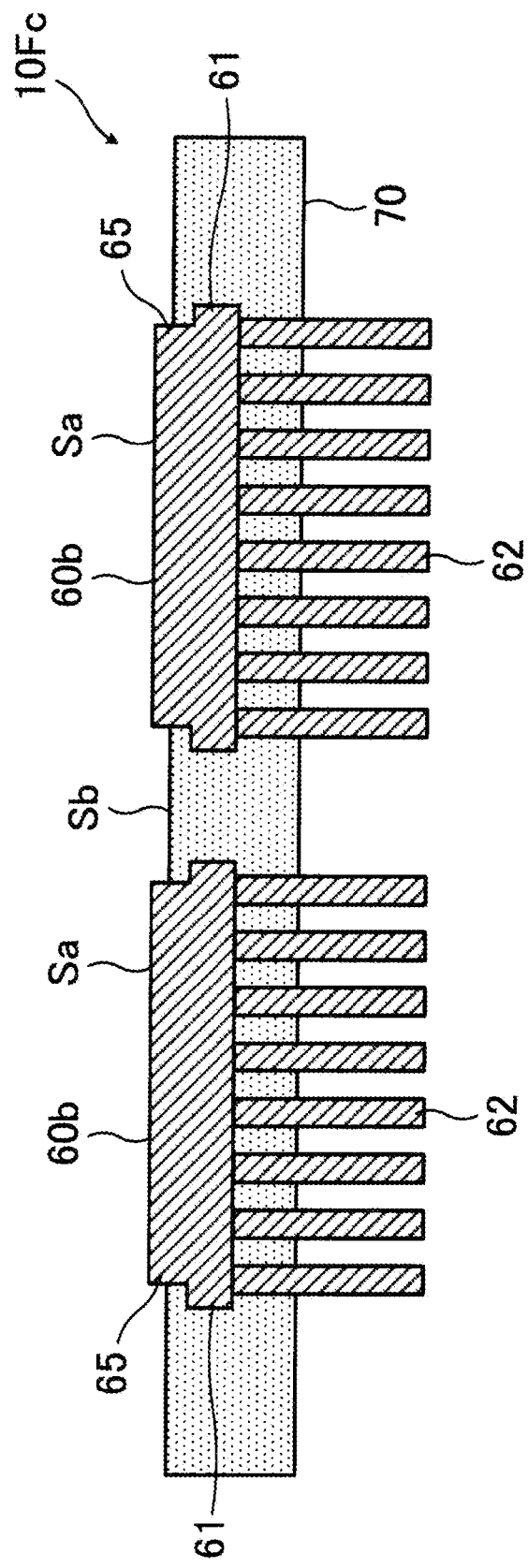
FIG. 26 illustrates the modification of the heat radiation member according to the sixth embodiment (part 2).

In addition, the heat radiation member 10F may have a structure illustrated in FIG. 25 or 26.

FIG. 25 illustrates modifications of the heat radiation member according to the sixth embodiment. FIG. 25(A) illustrates a first modification of the heat radiation member according to the sixth embodiment and FIG. 25(B) illustrates a second modification of the heat radiation member according to the sixth embodiment.

With a heat radiation member 10Fa illustrated in FIG. 25(A), different copper type members 30f are connected together by tie bars 33. With a heat radiation member 10Fb illustrated in FIG. 25(B), a copper type member 30g of large size on which protrusions 34 are formed in four areas is used.

By adopting the heat radiation member 10Fa or 10Fb, the copper type members 30f or the copper type member 30g can be handled easily. In addition, temperature distribution in the heat radiation member 10Fa or 10Fb can be made uniform and heat radiation efficiency can be enhanced.

In the above heat radiation member 10F, 10Fa, or 10Fb irregularities 32 which are the same as those illustrated in FIG. 7 may be formed on all or part of the sides of each copper type member 30f or the copper type member 30g which touch the aluminum type member 20.

FIG. 26 illustrates a third modification of the heat radiation member according to the sixth embodiment.

With a heat radiation member 10Fc illustrated in FIG. 26, copper type members 60b each including a base section 61 to a protrusion 65 of which the semiconductor device 40 is bonded and a plurality of fins 62 arranged on the base section 61 are used. Each copper type member 60b is covered with an aluminum type member 70 so that a surface Sa of the protrusion 65 and tip portions of the fins 62 will be exposed. The protrusion 65 protrudes from an end Sb of the aluminum type member 70.

As a result, the positioning of the semiconductor device 40, a bonding layer 45, and the heat radiation member 10Fc can be performed easily and accurately. In addition, heat radiation efficiency can be enhanced by the fins 62 of each copper type member 60b.

In the above heat radiation member 10Fc irregularities 32 which are the same as those illustrated in FIG. 7 may be formed on all or part of the sides of each copper type member 60b which touch the aluminum type member 70.

The heat radiation member and the semiconductor module including the heat radiation member and the semiconductor devices have been described. However, the number of the semiconductor devices included in the semiconductor module is not limited to the above examples (that is to say, four). Each heat radiation member having the above structure is applicable to the cooling of one or more semiconductor devices. The number of the copper type members included in each heat radiation member can be set according to the number of the semiconductor devices. In this case, it is not necessary that the number of the semiconductor devices should be equal to the number of the copper type members included in each heat radiation member. Furthermore, in the above description the case where one semiconductor device includes four semiconductor elements is taken as an example. However, the number of semiconductor elements is not limited to four.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

REFERENCE SIGNS LIST 10A, 10Aa, 10Ab, 10Ac, 10Ad, 10B, 10Ba, 10Bb, 10C, 10Ca, 10Cb, 10D, 10Da, 10Db, 10E, 10Ea, 10Eb, 10Ec, 10Ed, 10F, 10Fa, 10Fb, 10Fc Heat Radiation Member
20, 70 Aluminum Type Member
21, 61 Base Section
22, 62 Fin
22a Plate-Like Fin
22b Pin-Like Fin
22c Staggered Fin
22d corrugated fin
30, 30a, 30b, 30d, 30f, 30g, 60, 60a, 60b, 60d Copper Type Member
31, 64 Step
32 Irregularity
33, 63 Tie Bar
34, 65 Protrusion 40 Semiconductor Device
41 Board
41*a* Insulating Board
41*b*, 41*c* Conductor Pattern
42, 43 Semiconductor Element
44, 45 Bonding Layer
50A, 50B, 50C, 50D, 50E, 50F Semiconductor Module
100 Metal Mold
101 Upper Metal Mold
102 Lower Metal Mold
Sa Surface
Sb End
H Cavity
p Pitch
h Height

The invention claimed is:

1. A semiconductor module comprising:
a heat radiation member including:
   a first member which contains aluminum; and
   a second member which contains copper, which is embedded in the first member, and sides of the second member being enclosed by the first member; and
a semiconductor element which is thermally connected to the heat radiation member, wherein:
the first member has a cavity,
the second member has a proximal surface in the cavity,
the second member has an exposed distal surface, opposite the proximal surface, which is exposed in the cavity of the first member,
four sides of the second member are enclosed by the first member,
the second member has four edge surfaces in the cavity, and
the first member covers four edge portions of the distal surface of the second member.

2. The semiconductor module according to claim 1, wherein fins are arranged over the first member.

3. The semiconductor module according to claim 1, wherein fins which penetrate the first member and which protrude from the first member are arranged over the second member.

4. The semiconductor module according to claim 1, wherein the exposed surface of the second member protrudes from an end of the first member.

5. The semiconductor module according to claim 1, wherein an end of the first member and the exposed surface of the second member are equal in level.

6. The semiconductor module according to claim 1, wherein:
the second member has a step at each of the edge portions on an exposed surface side; and
the first member covers the edge portions.

7. The semiconductor module according to claim 1, wherein the sides of the second member which touch the first member are irregular.

8. A heat radiation member comprising:
a first member which contains aluminum; and
a second member which contains copper, which is embedded in the first member, and sides of the second member being enclosed by the first member, wherein:
the first member has a cavity,
the second member has a proximal surface in the cavity,
the second member has an exposed distal surface, opposite the proximal surface, which is exposed in the cavity of the first member,
four sides of the second member are enclosed by the first member,
the second member has four edge surfaces in the cavity, and
the first member covers four edge portions of the distal surface of the second member.

* * * * *